(12) United States Patent
Burak et al.

(10) Patent No.: US 9,203,374 B2
(45) Date of Patent: Dec. 1, 2015

(54) FILM BULK ACOUSTIC RESONATOR COMPRISING A BRIDGE

(75) Inventors: Dariusz Burak, Fort Collins, CO (US); Phil Nikkel, Loveland, CO (US); Chris Feng, Fort Collins, CO (US); Alexandre Shirakawa, San Jose, CA (US); John Choy, Westminster, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 690 days.

(21) Appl. No.: 13/151,631

(22) Filed: Jun. 2, 2011

(65) Prior Publication Data

US 2012/0218057 A1    Aug. 30, 2012

Related U.S. Application Data

(63) Continuation-in-part of application No. 13/074,262, filed on Mar. 29, 2011, now Pat. No. 9,136,818, and a continuation-in-part of application No. 13/036,489, filed on Feb. 28, 2011.

(51) Int. Cl.
| | |
|---|---|
| *H03H 9/15* | (2006.01) |
| *H03H 9/13* | (2006.01) |
| *H03H 9/02* | (2006.01) |
| *H03H 9/17* | (2006.01) |
| *H03H 3/04* | (2006.01) |

(52) U.S. Cl.
CPC ........... *H03H 9/132* (2013.01); *H03H 9/02007* (2013.01); *H03H 9/02086* (2013.01); *H03H 9/173* (2013.01); *H03H 9/175* (2013.01); *H03H 3/04* (2013.01)

(58) Field of Classification Search
CPC ............ H03H 9/02086; H03H 9/0211; H03H 9/02118; H03H 9/171–9/175; H03H 9/177; H03H 9/54; H03H 9/564; H03H 9/582; H03H 9/587–9/589; H03H 9/02; H03H 9/132; H03H 9/585; H03H 9/02007
USPC ............. 333/187–192; 310/322, 323.01, 334, 310/335
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |

(Continued)

FOREIGN PATENT DOCUMENTS

| | | |
|---|---|---|
| CN | 1845453 A | 10/2006 |
| CN | 101170303 | 4/2008 |

(Continued)

OTHER PUBLICATIONS

"Use of perimeter in a Sentence With perimeter Sentence Examples", from website http://www.reference.com/example-sentences/perimeter; Dictionary.com, LLC. Copyright 2014, one page downloaded Oct. 22, 2014.*

(Continued)

*Primary Examiner* — Barbara Summons

(57) ABSTRACT

A film bulk acoustic resonator (FBAR) structure includes a first electrode disposed over a substrate, a piezoelectric layer disposed over the first electrode, and a second electrode disposed over the first piezoelectric layer. A bridge is disposed between the first electrode and the piezoelectric layer.

20 Claims, 11 Drawing Sheets

(56) References Cited

U.S. PATENT DOCUMENTS

| | | |
|---|---|---|
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,344,004 A | 8/1982 | Okubo |
| 4,355,408 A | 10/1982 | Scarrott |
| 4,456,850 A | 6/1984 | Inoue et al. |
| 4,529,904 A | 7/1985 | Hattersley |
| 4,608,541 A | 8/1986 | Moriwaki et al. |
| 4,625,138 A | 11/1986 | Ballato |
| 4,640,756 A | 2/1987 | Wang et al. |
| 4,719,383 A | 1/1988 | Wang et al. |
| 4,769,272 A | 9/1988 | Byrne et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | McClanahan et al. |
| 4,906,840 A | 3/1990 | Zdeblick et al. |
| 4,975,892 A | 12/1990 | Defranould et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,166,646 A | 11/1992 | Avanic et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,475,351 A | 12/1995 | Uematsu et al. |
| 5,548,189 A | 8/1996 | Williams |
| 5,567,334 A | 10/1996 | Baker et al. |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,704,037 A | 12/1997 | Chen |
| 5,705,877 A | 1/1998 | Shimada |
| 5,714,917 A | 2/1998 | Ella |
| 5,729,008 A | 3/1998 | Blalock et al. |
| 5,789,845 A | 8/1998 | Wadaka et al. |
| 5,835,142 A | 11/1998 | Nakamura et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,903,087 A | 5/1999 | Mattson et al. |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa et al. |
| 6,051,907 A | 4/2000 | Ylilammi |
| 6,060,818 A | 5/2000 | Ruby et al. |
| 6,087,198 A | 7/2000 | Panasik |
| 6,090,687 A | 7/2000 | Merchant et al. |
| 6,107,721 A | 8/2000 | Lakin |
| 6,111,341 A | 8/2000 | Hirama |
| 6,111,480 A | 8/2000 | Iyama et al. |
| 6,114,795 A | 9/2000 | Tajima et al. |
| 6,118,181 A | 9/2000 | Merchant et al. |
| 6,124,678 A | 9/2000 | Bishop et al. |
| 6,124,756 A | 9/2000 | Yaklin et al. |
| 6,131,256 A | 10/2000 | Dydyk |
| 6,150,703 A | 11/2000 | Cushman et al. |
| 6,187,513 B1 | 2/2001 | Katakura |
| 6,198,208 B1 | 3/2001 | Yano et al. |
| 6,215,375 B1 | 4/2001 | Larson, III et al. |
| 6,219,032 B1 | 4/2001 | Rosenberg et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,284,121 B1 | 9/2001 | Reid |
| 6,292,336 B1 | 9/2001 | Horng et al. |
| 6,306,755 B1 | 10/2001 | Zheng |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,679 B1 | 5/2002 | Lorenz |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella et al. |
| 6,498,604 B1 | 12/2002 | Jensen |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,528,344 B2 | 3/2003 | Kang |
| 6,530,515 B1 | 3/2003 | Glenn et al. |
| 6,534,900 B2 | 3/2003 | Aigner et al. |

(56) References Cited

U.S. PATENT DOCUMENTS

| | | |
|---|---|---|
| 6,542,054 B2 | 4/2003 | Aigner et al. |
| 6,542,055 B1 | 4/2003 | Frank et al. |
| 6,548,942 B1 | 4/2003 | Panasik |
| 6,548,943 B2 | 4/2003 | Kaitila et al. |
| 6,549,394 B1 | 4/2003 | Williams |
| 6,550,664 B2 | 4/2003 | Bradley et al. |
| 6,559,487 B1 | 5/2003 | Kang et al. |
| 6,559,530 B2 | 5/2003 | Hinzel et al. |
| 6,564,448 B1 | 5/2003 | Oura et al. |
| 6,566,956 B2 | 5/2003 | Ohnishi et al. |
| 6,566,979 B2 | 5/2003 | Larson, III et al. |
| 6,580,159 B1 | 6/2003 | Fusaro et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,603,182 B1 | 8/2003 | Low et al. |
| 6,617,249 B2 | 9/2003 | Ruby et al. |
| 6,617,750 B2 | 9/2003 | Dummermuth et al. |
| 6,617,751 B2 | 9/2003 | Sunwoo et al. |
| 6,621,137 B1 | 9/2003 | Ma et al. |
| 6,630,753 B2 | 10/2003 | Malik et al. |
| 6,635,509 B1 | 10/2003 | Ouellet |
| 6,639,872 B1 | 10/2003 | Rein |
| 6,650,205 B2 | 11/2003 | Goetz et al. |
| 6,651,488 B2 | 11/2003 | Larson, III et al. |
| 6,657,363 B1 | 12/2003 | Aigner |
| 6,668,618 B2 | 12/2003 | Larson, III et al. |
| 6,670,866 B2 | 12/2003 | Ella et al. |
| 6,677,929 B2 | 1/2004 | Gordon et al. |
| 6,693,500 B2 | 2/2004 | Yang et al. |
| 6,709,776 B2 | 3/2004 | Noguchi et al. |
| 6,710,508 B2 | 3/2004 | Ruby et al. |
| 6,710,681 B2 | 3/2004 | Figueredo et al. |
| 6,713,314 B2 | 3/2004 | Wong et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Plazza et al. |
| 6,738,267 B1 | 5/2004 | Navas Sabater et al. |
| 6,750,593 B2 | 6/2004 | Iwata |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,787,897 B2 | 9/2004 | Geefay et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,820,469 B1 | 11/2004 | Adkins et al. |
| 6,828,713 B2 | 12/2004 | Bradley et al. |
| 6,842,088 B2 | 1/2005 | Yamada et al. |
| 6,842,089 B2 | 1/2005 | Lee |
| 6,849,475 B2 | 2/2005 | Kim |
| 6,853,534 B2 | 2/2005 | Williams |
| 6,861,920 B2 | 3/2005 | Ishikawa et al. |
| 6,872,931 B2 | 3/2005 | Liess et al. |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,894,588 B2 | 5/2005 | Detlefsen |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,919,222 B2 | 7/2005 | Geefay |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,933,809 B2 | 8/2005 | Kyoung et al. |
| 6,936,837 B2 | 8/2005 | Yamada et al. |
| 6,936,928 B2 | 8/2005 | Hedler et al. |
| 6,936,954 B2 | 8/2005 | Peczalski |
| 6,941,036 B2 | 9/2005 | Lucero |
| 6,943,647 B2 | 9/2005 | Aigner |
| 6,943,648 B2 | 9/2005 | Maiz et al. |
| 6,946,928 B2 | 9/2005 | Larson, III et al. |
| 6,954,121 B2 | 10/2005 | Bradley et al. |
| 6,963,257 B2 | 11/2005 | Ella et al. |
| 6,970,365 B2 | 11/2005 | Turchi |
| 6,975,183 B2 | 12/2005 | Aigner et al. |
| 6,977,563 B2 | 12/2005 | Komuro et al. |
| 6,979,597 B2 | 12/2005 | Geefay et al. |
| 6,985,051 B2 | 1/2006 | Nguyen et al. |
| 6,985,052 B2 | 1/2006 | Tikka |
| 6,987,433 B2 | 1/2006 | Larson, III et al. |
| 6,989,723 B2 | 1/2006 | Komuro et al. |
| 6,998,940 B2 | 2/2006 | Metzger |
| 7,002,437 B2 | 2/2006 | Takeuchi et al. |
| 7,019,604 B2 | 3/2006 | Gotoh et al. |
| 7,019,605 B2 | 3/2006 | Larson, III |
| 7,026,876 B1 | 4/2006 | Esfandiari et al. |
| 7,053,456 B2 | 5/2006 | Matsuo |
| 7,057,476 B2 | 6/2006 | Hwu |
| 7,057,478 B2 | 6/2006 | Korden et al. |
| 7,064,606 B2 | 6/2006 | Louis |
| 7,084,553 B2 | 8/2006 | Ludwiczak |
| 7,091,649 B2 | 8/2006 | Larson, III et al. |
| 7,098,758 B2 | 8/2006 | Wang et al. |
| 7,102,460 B2 | 9/2006 | Schmidhammer et al. |
| 7,109,826 B2 | 9/2006 | Ginsburg et al. |
| 7,128,941 B2 | 10/2006 | Lee |
| 7,129,806 B2 | 10/2006 | Sato |
| 7,138,889 B2 | 11/2006 | Lakin |
| 7,148,466 B2 | 12/2006 | Eckman et al. |
| 7,158,659 B2 | 1/2007 | Baharav et al. |
| 7,161,283 B1 | 1/2007 | Geefay |
| 7,161,448 B2 | 1/2007 | Feng et al. |
| 7,170,215 B2 | 1/2007 | Namba et al. |
| 7,173,504 B2 | 2/2007 | Larson, III et al. |
| 7,179,392 B2 | 2/2007 | Robert et al. |
| 7,187,254 B2 | 3/2007 | Su et al. |
| 7,199,683 B2 | 4/2007 | Thalhammer |
| 7,209,374 B2 | 4/2007 | Noro |
| 7,212,083 B2 | 5/2007 | Inoue et al. |
| 7,212,085 B2 | 5/2007 | Wu |
| 7,230,509 B2 | 6/2007 | Stoemmer |
| 7,230,511 B2 | 6/2007 | Onishi et al. |
| 7,233,218 B2 | 6/2007 | Park et al. |
| 7,235,462 B2 | 6/2007 | Letertre et al. |
| 7,235,915 B2 | 6/2007 | Nakamura et al. |
| 7,242,270 B2 | 7/2007 | Larson, III et al. |
| 7,259,498 B2 | 8/2007 | Nakatsuka et al. |
| 7,268,647 B2 | 9/2007 | Sano et al. |
| 7,275,292 B2 | 10/2007 | Ruby et al. |
| 7,276,994 B2 | 10/2007 | Takeuchi et al. |
| 7,280,007 B2 | 10/2007 | Feng |
| 7,281,304 B2 | 10/2007 | Kim et al. |
| 7,294,919 B2 | 11/2007 | Bai |
| 7,301,258 B2 | 11/2007 | Tanaka |
| 7,310,861 B2 | 12/2007 | Aigner et al. |
| 7,313,255 B2 | 12/2007 | Machida et al. |
| 7,332,985 B2 | 2/2008 | Larson, III et al. |
| 7,345,409 B2 | 3/2008 | Leidl et al. |
| 7,345,410 B2 | 3/2008 | Grannen et al. |
| 7,358,831 B2 | 4/2008 | Larson et al. |
| 7,367,095 B2 | 5/2008 | Larson, III et al. |
| 7,368,857 B2 | 5/2008 | Tanaka |
| 7,369,013 B2 | 5/2008 | Fazzio et al. |
| 7,385,467 B2 | 6/2008 | Stoemmer et al. |
| 7,388,318 B2 | 6/2008 | Yamada et al. |
| 7,388,454 B2 | 6/2008 | Ruby et al. |
| 7,388,455 B2 | 6/2008 | Larson, III |
| 7,391,286 B2 | 6/2008 | Jamneala et al. |
| 7,400,217 B2 | 7/2008 | Larson, III et al. |
| 7,408,428 B2 | 8/2008 | Larson, III |
| 7,414,349 B2 | 8/2008 | Sasaki |
| 7,414,495 B2 | 8/2008 | Iwasaki et al. |
| 7,420,320 B2 | 9/2008 | Sano et al. |
| 7,423,503 B2 | 9/2008 | Larson, III et al. |

(56) References Cited

U.S. PATENT DOCUMENTS

| | | |
|---|---|---|
| 7,425,787 B2 | 9/2008 | Larson, III |
| 7,439,824 B2 | 10/2008 | Aigner |
| 7,463,118 B2 | 12/2008 | Jacobsen |
| 7,466,213 B2 | 12/2008 | Lobl et al. |
| 7,468,608 B2 | 12/2008 | Feucht et al. |
| 7,482,737 B2 | 1/2009 | Yamada et al. |
| 7,508,286 B2 | 3/2009 | Ruby et al. |
| 7,515,018 B2 | 4/2009 | Handtmann et al. |
| 7,535,154 B2 | 5/2009 | Umeda et al. |
| 7,535,324 B2 | 5/2009 | Fattinger et al. |
| 7,545,532 B2 | 6/2009 | Muramoto |
| 7,561,009 B2 | 7/2009 | Larson, III et al. |
| 7,563,475 B2 | 7/2009 | Ruby et al. |
| 7,567,023 B2 | 7/2009 | Iwaki et al. |
| 7,575,292 B2 | 8/2009 | Furukawa |
| 7,576,471 B1 | 8/2009 | Solal |
| 7,602,101 B2 | 10/2009 | Hara et al. |
| 7,602,102 B1 * | 10/2009 | Barber et al. .............. 310/320 |
| 7,616,079 B2 | 11/2009 | Tikka et al. |
| 7,619,493 B2 | 11/2009 | Uno et al. |
| 7,629,865 B2 | 12/2009 | Ruby |
| 7,649,304 B2 | 1/2010 | Umeda et al. |
| 7,655,963 B2 | 2/2010 | Sadaka et al. |
| 7,684,109 B2 | 3/2010 | Godshalk et al. |
| 7,714,684 B2 | 5/2010 | Ruby et al. |
| 7,737,807 B2 | 6/2010 | Larson et al. |
| 7,758,979 B2 | 7/2010 | Akiyama et al. |
| 7,768,364 B2 | 8/2010 | Hart et al. |
| 7,791,434 B2 | 9/2010 | Fazzio et al. |
| 7,795,781 B2 | 9/2010 | Barber et al. |
| 7,869,187 B2 | 1/2011 | McKinzie et al. |
| 7,889,024 B2 | 2/2011 | Bradley et al. |
| 7,966,722 B2 | 6/2011 | Hart et al. |
| 7,978,025 B2 | 7/2011 | Yokoama et al. |
| 8,008,993 B2 | 8/2011 | Milsom et al. |
| 8,084,919 B2 | 12/2011 | Nishihara et al. |
| 8,188,810 B2 | 5/2012 | Fazzio et al. |
| 8,230,562 B2 | 7/2012 | Fazzio et al. |
| 8,248,185 B2 | 8/2012 | Choy et al. |
| 8,384,497 B2 | 2/2013 | Zhang |
| 8,456,257 B1 | 6/2013 | Fattinger |
| 8,575,820 B2 | 11/2013 | Shirakawa et al. |
| 2001/0045793 A1 | 11/2001 | Misu et al. |
| 2002/0000646 A1 | 1/2002 | Gooch et al. |
| 2002/0030424 A1 | 3/2002 | Iwata |
| 2002/0063497 A1 | 5/2002 | Panasik |
| 2002/0070463 A1 | 6/2002 | Chang et al. |
| 2002/0121944 A1 | 9/2002 | Larson, III et al. |
| 2002/0121945 A1 | 9/2002 | Ruby et al. |
| 2002/0126517 A1 | 9/2002 | Matsukawa et al. |
| 2002/0140520 A1 | 10/2002 | Hikita et al. |
| 2002/0152803 A1 | 10/2002 | Larson, III et al. |
| 2002/0158716 A1 | 10/2002 | Pensala |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0011285 A1 | 1/2003 | Ossmann |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0132809 A1 | 7/2003 | Senthilkumar et al. |
| 2003/0141946 A1 | 7/2003 | Ruby et al. |
| 2003/0179053 A1 | 9/2003 | Aigner et al. |
| 2003/0205948 A1 | 11/2003 | Lin et al. |
| 2003/0227357 A1 | 12/2003 | Metzger et al. |
| 2004/0016995 A1 | 1/2004 | Kuo et al. |
| 2004/0017130 A1 | 1/2004 | Wang et al. |
| 2004/0027216 A1 | 2/2004 | Ma et al. |
| 2004/0056735 A1 | 3/2004 | Nomura et al. |
| 2004/0092234 A1 | 5/2004 | Pohjonen |
| 2004/0099898 A1 | 5/2004 | Grivna et al. |
| 2004/0124952 A1 | 7/2004 | Tikka |
| 2004/0129079 A1 | 7/2004 | Kato et al. |
| 2004/0150293 A1 | 8/2004 | Unterberger |
| 2004/0150296 A1 | 8/2004 | Park et al. |
| 2004/0166603 A1 | 8/2004 | Carley |
| 2004/0188241 A1 | 9/2004 | Rich et al. |
| 2004/0195937 A1 | 10/2004 | Matsubara et al. |
| 2004/0212458 A1 | 10/2004 | Lee |
| 2004/0246075 A1 | 12/2004 | Bradley et al. |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0012716 A1 | 1/2005 | Mikulin et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0093396 A1 | 5/2005 | Larson, III et al. |
| 2005/0093397 A1 | 5/2005 | Yamada et al. |
| 2005/0093653 A1 | 5/2005 | Larson, III |
| 2005/0093654 A1 | 5/2005 | Larson, III et al. |
| 2005/0093655 A1 | 5/2005 | Larson, III et al. |
| 2005/0093657 A1 | 5/2005 | Larson, III et al. |
| 2005/0093658 A1 | 5/2005 | Larson, III et al. |
| 2005/0093659 A1 | 5/2005 | Larson, III et al. |
| 2005/0104690 A1 | 5/2005 | Larson, III et al. |
| 2005/0110598 A1 | 5/2005 | Larson, III |
| 2005/0128030 A1 | 6/2005 | Larson, III et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0206479 A1 | 9/2005 | Nguyen et al. |
| 2005/0206483 A1 | 9/2005 | Pashby et al. |
| 2005/0218488 A1 | 10/2005 | Matsuo |
| 2005/0248232 A1 | 11/2005 | Itaya et al. |
| 2005/0269904 A1 | 12/2005 | Oka |
| 2005/0275486 A1 | 12/2005 | Feng |
| 2006/0017352 A1 | 1/2006 | Tanielian |
| 2006/0038636 A1 | 2/2006 | Tsurumi et al. |
| 2006/0071736 A1 | 4/2006 | Ruby et al. |
| 2006/0081048 A1 | 4/2006 | Mikado et al. |
| 2006/0087199 A1 | 4/2006 | Larson, III et al. |
| 2006/0103492 A1 | 5/2006 | Feng et al. |
| 2006/0114541 A1 | 6/2006 | Van Beek |
| 2006/0119453 A1 | 6/2006 | Fattinger et al. |
| 2006/0125489 A1 | 6/2006 | Feucht et al. |
| 2006/0132262 A1 | 6/2006 | Fazzio et al. |
| 2006/0164183 A1 | 7/2006 | Tikka et al. |
| 2008/0164186 A1 | 7/2006 | Stoemer et al. |
| 2006/0176126 A1 | 8/2006 | Wang et al. |
| 2006/0185139 A1 | 8/2006 | Larson, III et al. |
| 2006/0197411 A1 | 9/2006 | Hoen et al. |
| 2006/0226932 A1 | 10/2006 | Fazzio et al. |
| 2006/0238070 A1 | 10/2006 | Costa et al. |
| 2006/0284706 A1 | 12/2006 | Ginsburg et al. |
| 2006/0284707 A1 | 12/2006 | Larson, III et al. |
| 2006/0290446 A1 | 12/2006 | Aigner et al. |
| 2007/0035364 A1 | 2/2007 | Sridhar et al. |
| 2007/0037311 A1 | 2/2007 | Izumi et al. |
| 2007/0040473 A1 | 2/2007 | Ballandras et al. |
| 2007/0069225 A1 | 3/2007 | Krames et al. |
| 2007/0080759 A1 | 4/2007 | Jamneala et al. |
| 2007/0085447 A1 | 4/2007 | Larson, III |
| 2007/0085631 A1 | 4/2007 | Larson, III et al. |
| 2007/0085632 A1 | 4/2007 | Larson, III et al. |
| 2007/0086080 A1 | 4/2007 | Larson, III et al. |
| 2007/0086274 A1 | 4/2007 | Nishimura et al. |
| 2007/0090892 A1 | 4/2007 | Larson, III |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2007/0266548 A1 | 11/2007 | Fattinger |
| 2007/0279153 A1 | 12/2007 | Ruby |
| 2007/0291164 A1 | 12/2007 | Goh et al. |

(56) References Cited

U.S. PATENT DOCUMENTS

| | | |
|---|---|---|
| 2008/0055020 A1 | 3/2008 | Handtmann et al. |
| 2008/0129414 A1 | 6/2008 | Lobl et al. |
| 2008/0129417 A1 | 6/2008 | Taniguchi |
| 2008/0143215 A1 | 6/2008 | Hara et al. |
| 2008/0258842 A1* | 10/2008 | Ruby et al. .................... 333/187 |
| 2008/0297278 A1 | 12/2008 | Handtmann et al. |
| 2008/0297279 A1 | 12/2008 | Thalhammer et al. |
| 2008/0297280 A1 | 12/2008 | Thalhammer et al. |
| 2009/0001848 A1 | 1/2009 | Umeda et al. |
| 2009/0064498 A1 | 3/2009 | Mok et al. |
| 2009/0079302 A1 | 3/2009 | Wall et al. |
| 2009/0096550 A1 | 4/2009 | Handtmann et al. |
| 2009/0102319 A1 | 4/2009 | Nakatsuka et al. |
| 2009/0127978 A1 | 5/2009 | Asai et al. |
| 2009/0153268 A1 | 6/2009 | Milsom et al. |
| 2009/0201594 A1 | 8/2009 | Smith |
| 2009/0267453 A1 | 10/2009 | Barber et al. |
| 2009/0267457 A1 | 10/2009 | Barber et al. |
| 2010/0013573 A1 | 1/2010 | Umeda |
| 2010/0033063 A1 | 2/2010 | Nishihara et al. |
| 2010/0039000 A1 | 2/2010 | Milsom et al. |
| 2010/0052176 A1 | 3/2010 | Kamada et al. |
| 2010/0052815 A1 | 3/2010 | Bradley et al. |
| 2010/0091370 A1 | 4/2010 | Mahrt et al. |
| 2010/0102358 A1 | 4/2010 | Lanzieri et al. |
| 2010/0107389 A1 | 5/2010 | Nessler et al. |
| 2010/0111808 A1 | 5/2010 | Pimputkar et al. |
| 2010/0148637 A1 | 6/2010 | Satou |
| 2010/0176899 A1 | 7/2010 | Schaufele et al. |
| 2010/0187948 A1 | 7/2010 | Sinha et al. |
| 2010/0207011 A1 | 8/2010 | Smith |
| 2010/0260453 A1 | 10/2010 | Block |
| 2010/0327697 A1 | 12/2010 | Choy et al. |
| 2010/0327994 A1 | 12/2010 | Choy et al. |
| 2011/0084779 A1 | 4/2011 | Zhang |
| 2011/0121689 A1 | 5/2011 | Grannen et al. |
| 2011/0121916 A1 | 5/2011 | Barber et al. |
| 2011/0148547 A1 | 6/2011 | Zhang |
| 2011/0180391 A1 | 7/2011 | Larson et al. |
| 2011/0204997 A1 | 8/2011 | Elbrecht et al. |
| 2011/0266925 A1 | 11/2011 | Ruby et al. |
| 2012/0154074 A1 | 6/2012 | Ruby et al. |
| 2012/0161902 A1 | 6/2012 | Feng et al. |
| 2012/0177816 A1 | 7/2012 | Larson et al. |
| 2012/0194297 A1 | 8/2012 | Choy |
| 2012/0218055 A1 | 8/2012 | Burak et al. |
| 2012/0218056 A1 | 8/2012 | Burak |
| 2012/0218057 A1 | 8/2012 | Burak et al. |
| 2012/0218058 A1 | 8/2012 | Burak et al. |
| 2012/0218059 A1 | 8/2012 | Burak et al. |
| 2012/0218060 A1 | 8/2012 | Burak et al. |
| 2012/0226807 A1 | 9/2012 | Panella et al. |
| 2012/0248941 A1 | 10/2012 | Shirakawa et al. |
| 2012/0280767 A1 | 11/2012 | Burak et al. |
| 2013/0038408 A1* | 2/2013 | Burak et al. .................... 333/187 |
| 2013/0063227 A1 | 3/2013 | Burak et al. |
| 2013/0106534 A1 | 5/2013 | Burak et al. |
| 2013/0127300 A1 | 5/2013 | Umeda et al. |
| 2013/0140959 A1 | 6/2013 | Shin et al. |
| 2014/0118090 A1 | 5/2014 | Grannen et al. |
| 2014/0132117 A1 | 5/2014 | Larson et al. |
| 2014/0354109 A1 | 12/2014 | Grannen et al. |

FOREIGN PATENT DOCUMENTS

| | | |
|---|---|---|
| CN | 101645699 A | 2/2010 |
| CN | 101931380 A | 12/2010 |
| DE | 10160617 | 6/2003 |
| DE | 10239317 | 3/2004 |
| DE | 102007012384 | 9/2008 |
| EP | 231892 | 8/1987 |
| EP | 0637875 | 2/1995 |
| EP | 689254 | 12/1995 |
| EP | 0865157 | 9/1998 |
| EP | 880227 | 11/1998 |
| EP | 1047189 | 10/2000 |
| EP | 1096259 | 5/2001 |
| EP | 1100196 | 5/2001 |
| EP | 1180494 | 2/2002 |
| EP | 1249932 | 10/2002 |
| EP | 1258989 | 11/2002 |
| EP | 1258990 | 11/2002 |
| EP | 1517443 | 3/2005 |
| EP | 1517444 | 3/2005 |
| EP | 1528674 | 5/2005 |
| EP | 1528675 | 5/2005 |
| EP | 1528676 | 5/2005 |
| EP | 1528677 | 5/2005 |
| EP | 1542362 | 6/2005 |
| EP | 1557945 | 7/2005 |
| EP | 1575165 | 9/2005 |
| EP | 0973256 | 9/2006 |
| EP | 2299592 | 3/2011 |
| EP | 2299593 | 3/2011 |
| FR | 2951027 | 4/2011 |
| GB | 1207974 | 10/1970 |
| GB | 2013343 | 8/1979 |
| GB | 2411239 | 8/2005 |
| GB | 2418791 | 4/2006 |
| GB | 2427773 | 1/2007 |
| JP | 59023612 | 2/1984 |
| JP | 61054686 | 3/1986 |
| JP | 6165507 | 4/1986 |
| JP | 62-109419 | 5/1987 |
| JP | 62-200813 | 9/1987 |
| JP | 1157108 | 6/1989 |
| JP | 1-295512 | 11/1989 |
| JP | 2-10907 | 1/1990 |
| JP | 06005944 | 1/1994 |
| JP | 8-330878 | 12/1996 |
| JP | 09-027729 | 1/1997 |
| JP | 9-83029 | 3/1997 |
| JP | 10-32456 | 2/1998 |
| JP | 1032456 | 2/1998 |
| JP | 10308645 | 11/1998 |
| JP | 2000-31552 | 1/2000 |
| JP | 2000076295 | 3/2000 |
| JP | 2000-232334 | 8/2000 |
| JP | 2000-295065 | 10/2000 |
| JP | 2000-332568 | 11/2000 |
| JP | 2001-102901 | 4/2001 |
| JP | 2001-508630 | 6/2001 |
| JP | 2002/217676 | 8/2002 |
| JP | 2003-017974 | 1/2003 |
| JP | 2003017964 | 1/2003 |
| JP | 2003-505905 | 2/2003 |
| JP | 2003/124779 | 4/2003 |
| JP | 2003-332872 | 11/2003 |
| JP | 2005-159402 | 6/2005 |
| JP | 2006-109472 | 4/2006 |
| JP | 2006-186412 | 7/2006 |
| JP | 2006-295924 | 10/2006 |
| JP | 2006-319796 | 11/2006 |
| JP | 2007-006501 | 1/2007 |
| JP | 2007/028669 | 2/2007 |
| JP | 2007-208845 | 8/2007 |
| JP | 2007-295306 | 11/2007 |
| JP | 2008-066792 | 3/2008 |
| JP | 2008-66792 | 3/2008 |
| JP | 2008-131194 | 6/2008 |
| JP | 2008-211394 | 9/2008 |
| WO | WO-98/16957 | 4/1998 |
| WO | WO-98/38736 | 9/1998 |
| WO | WO-98/56049 | 12/1998 |
| WO | WO-99/37023 | 7/1999 |
| WO | WO-01/06646 | 1/2001 |
| WO | WO-01/06647 | 1/2001 |
| WO | WO-0199276 | 12/2001 |
| WO | WO-02/103900 | 12/2002 |
| WO | WO-03/030358 | 4/2003 |
| WO | WO 03/043188 | 5/2003 |
| WO | WO-03/050950 | 6/2003 |
| WO | WO-03/058809 | 7/2003 |

(56) References Cited

FOREIGN PATENT DOCUMENTS

| WO | WO-2004/034579 | 4/2004 |
| WO | WO-2004/051744 | 6/2004 |
| WO | WO-2004/102688 | 11/2004 |
| WO | WO-2005/043752 | 5/2005 |
| WO | WO-2005/043753 | 5/2005 |
| WO | WO-2005/043756 | 5/2005 |
| WO | WO-2006/018788 | 2/2006 |

OTHER PUBLICATIONS

U.S. Appl. No. 10/971,169, filed Oct. 22, 2004, Larson III, John D., et al.

"GB Search Report for", Application No. GB0522393.8 Jan. 9, 2006, 4 pages.

"GB Search Report for Application No.", GB0525884.3 Feb. 2, 2006, 4 pgs.

"British Search Report Application No.", 0605222.9 Jul. 11, 2006.

"Co-pending U.S. Appl. No. 13/036,489, filed Feb. 28, 2011".

"Co-pending U.S. Appl. No. 13/074,262, filed Mar. 29, 2011".

"Co-pending U.S. Appl. No. 13/101,376, filed May 5, 2011".

"Examination report corresponding to application No.", GB0605770.7 Aug. 25, 2006.

"Examination Report from UK for application", GB 0605971.1 Aug. 24, 2006.

"Search Report for Great Britain Patent Application", No. 0617742.2 Mar. 29, 2007.

"Search Report for Great Britain Patent Application" No. 0617742.2 Dec. 13, 2006.

"Search Report from corresponding application", No. GB0605225.2 Jun. 26, 2006.

"Search report from corresponding application No.", GB0620152.9 Nov. 15, 2006.

"Search report from corresponding application No.", GB0620653.6 Nov. 17, 2006.

"Search report from corresponding application No.", GB0620655.1 Nov. 17, 2006.

"Search Report from corresponding application No.", GB0620657.7 Nov. 23, 2006.

"Search Report from corresponding application No.'", GB 0605779.8. Aug. 23, 2006.

"Search Report in the Great Britian Patent Application", No. 0619698.4 Nov. 30, 2006.

Akiyama, et al., "Enhancement of Piezoelectric Response in Scandium Aluminum Nitride Alloy Thin Films Prepared by Dual Reactive Cosputtering", *Adv. Mater* 2009, 593-596.

Al-Ahmed, M. et al., "Piezoelectric-Based Tunable Microstrip Shunt Resonator", *Proceedings of Asia-Pacific Microwave Conference* 2006.

Aoyama, Takayuki et al., "Diffusion of Boron, Phosphorous, Arsenic and Antimony in Thermally Grown SiliconDioxide", *Journal of the Electrochemical Society*, vol. 146, No. 5 1999, 1879-1883.

Auld, B. A., "Acoustic Resonators", *Acoustic Fields and Waves in Solids, Second Edition* vol. II 1990, 250-259.

Bauer, L. O. et al., "Properties of Silicon Implanted with Boron Ions through Thermal Silicon Dioxide", *Solid State Electronics*, vol. 16, No. 3 Mar. 1973, 289-300.

BI, F.Z., "Bulk Acoustic Wave RF Technology", *IEEE Microwave Magazine*, vol. 9, Issue 5. 2008, 65-80.

Chen, , "Fabrication and Characterization of ALN Thin Film Bulk Acoustic Wave Resonator", *Dissertation, University of Pittsburgh School of Engineering* 2006.

Choi, Sungjin et al., "Design of Half-Bridge Piezo-Transformer Converters in the AC Adapter Applications", *APEC 2005, IEEE* Mar. 2005, 244-248.

Coombs, Clyde F. , "Electronic Instrument Handbook", *Second Edition, McGraw-Hill Inc.* 1995, pp. 5.1 to 5.29.

C-S Lee, et al., "Copper-Airbridged Low-Noise GaAs PHEMT With Ti/WN$_x$/Ti Diffusion Barrier for High-Frequency", *IEEE Transactions on Electron Devices*, vol. 53 Issue: 8, 2006, 1753-1758.

Denisse, C.M.M. et al., "Plasma-Enhanced Growth and Composition of Silicon Oxynitride Films", *J. Appl. Phys.*, vol. 60 No. 7. Oct. 1, 1986, 2536-2542.

Fattinger, G. G. et al., "Coupled Bulk Acoustic Wave Resonator Filters: Key technology for single-to-balanced RF filters", 0-7803-8331-1/4/W20.00; *IEEE.MTT-S Digest* 2004, 927-929.

Fattinger, G.G. et al., "Single-To-Balance Filters for Mobile Phones Using Coupled Resonator BAW Technology", *2004 IEEE Ultrasonics Symposium* Aug. 2004, 416-419.

Fattinger, G. B. et al., "Spurious Mode Suppression in Coupled Resonator Filters", *IEEE MTT-S International Microwave Symposium Digest* 2005, 409-412.

Gilbert, S. R. , "An Ultra-Miniature, Low Cost Single Ended to Differential Filter for ISM Band Applications", *Micro. Symp. Digest, 2008 IEEE MTT-S* Jun. 2008, 839-842.

Grill, A. et al., "Ultralow-K Dielectrics Prepared by Plasma-Enhanced Chemical Vapor Deposition", *App. Phys. Lett*, vol. 79 2001, 803-805.

Hadimioglu, B. et al., ""Polymer Films As Acoustic Matching Layers"."*1990 IEEE Ultrasonics Symposium Proceedings*, vol. 3 PP. [Previously submitted as "Polymer Files as Acoustic Matching Layers, 1990 IEEE Ultrasonics Symposium Proceeding. vol. 4 pp. 1227-1340, Dec. 1990", Considered by Examiner on Mar. 20, 2007 Dec. 1990, 1337-1340.

Hara, K. ,"Surface Treatment of Quartz Oscillator Plate by Ion Implantation", *Oyo Buturi*, vol. 47, No. 2 Feb. 1978, 145-146.

Holzlohner, Ronald et al., "Accurate Calculation of Eye Diagrams and Bit Error Rates in Optical Transmission Systems Using Linearization", *Journal of Lightwave Technology*, vol. 20, No. 3, Mar. 2002, pp. 389-400.

Ivensky, Gregory et al., "A Comparison of Piezoelectric Transformer AC/DC Converters with Current Doubler and voltage Doubler Rectifiers", *IEEE Transactions on Power Electronics*, vol. 19 No. 6. Nov. 2004.

Jamneala, T. et al., "Coupled Resonator Filter with Single-Layer Acoustic Coupler", *IEEE Transaction on Ultrasonics, Ferroelectrics, and Frequency Control*, vol. 55 Oct. 2008, 2320-2326.

Jamneala, Tiberiu et al., "Ultra-Miniature Coupled Resonator Filter with Single-Layer Acoustic Coupler", *IEEE Transactions on Ultrasonics, Ferroelectrics, and Frequency Control*, vol. 56, No. 11. Nov. 2009, 2553-2558.

Jiang, Yimin et al., "A Novel Single-Phase Power Factor Correction Scheme", *IEEE* 1993, 287-292.

Jung, Jun-Phil et al., "Experimental and Theoretical Investigation on the Relationship Between AIN Properties and AIN-Based FBAR Characteristics", *2003 IEEE International Frequency Control Symposium and PDA Exhibition Jointly with the 17th European Frequency and Time Forum* Sep. 3, 2003, 779-784.

Kaitila, J. et al., "Measurement of Acoustical Parameters of Thin Films", *2006 IEEE Ultrasonics Symposium* Oct. 2006, 464-467.

Krishnaswamy, S.V. et al., "Film Bulk Acoustic Wave Resonator Technology", May 29, 1990, 529-536.

Lakin, K.M. , "Bulk Acoustic Wave Coupled Resonator Filters", *2002 IEEE International Frequency Control Symposium and PDA Exhibition* May 2002, 8-14.

Lakin, K.M. , "Coupled Resonator Filters", *2002 IEEE Ultrasonics Symposium* Mar. 2, 2002, 901-908.

Lakin, K.M. et al., "High Performance Stacked Crystal Filters for GPS and Wide Bandwidth Applications", *2001 IEEE Ultrasonics Symposium* Jan. 1, 2001, 833-838.

Lakin, K. M. et al., "Temperature Compensated Bulk Acoustic Thin Film Resonators", *IEEE Ultrasonics Symposium*, San Juan, Puerto Rico Oct. 2000, 855-858.

Lakin, K.M. , "Thin Film BAW Filters for Wide Bandwidth and High Performance Applications", *IEEE Microwave Symposium Digest*: vol. 2 Jun. 6-11, 2004, 923-926.

Lakin, K. M. , "Thin Film Resonators and Filters", *IEEE Untrasonics Symposium*, Caesar's Tahoe, NV Oct. 1999, 895-906.

Lakin, et al., "Wide Bandwidth Thin Film BAW Filters", *2004 IEEE Ultrasonics Symposium*, vol. 1, Aug. 2004, 407-410.

Larson III, John D. et al., "Measurement of Effective Kt2,Q,Rp,Rs vs. Temperature for Mo/AIN FBAR Resonators", *IEEE Ultrasonics Symposium* 2002, 939-943.

(56) References Cited

OTHER PUBLICATIONS

Lee, Jiunn-Homg et al., "Optimization of Frame-Like Film Bulk Acoustic Resonators for Suppression of Spurious Lateral Modes Using Finite Element Method", *IEEE Ultrasonic Symposium*, vol. 1, 2004, 278-281.

Li, Yunxiu et al., "AC-DC Converter with Worldwide Range Input Voltage by Series and Parallel Piezoelectric Transformer Connection", *35th Annual IEEE Power Electronics Specialists Conference* 2004.

Lobl, H.P. et al., "Piezoelectric Materials for BAW Resonators and Filters", *2001 IEEE Ultrasonic Symposium* Jan. 1, 2001, 807-811.

Loboda, M. J., "New Solutions for Intermetal Dielectrics Using Trimethylsilane-Based PECVD Processes", *Microelectronics Eng.*, vol. 50, 2000, 15-23.

Martin, Steven J. et al., "Development of a Low Dielectric Constant Polymer for the Fabrication of Integrated Circuit Interconnect", *12 Advanced Materials* Dec. 23, 2000, 1769-1778.

Martin, et al., "Re-growth of C-Axis Oriented AlN Thin Films", *IEEE Ultrasonics Symposium* 2006, 169-172.

Martin, et al., "Shear Mode Coupling and Tilted Gram Growth of AlN Thin Films in BAW Resonators", *IEEE Transactions on Ultrasonics, Ferroelectrics, and Frequency Control*, vol. 53, No. 7 Jul. 2006, 1339-1343.

Martinez, et al., "High confinement suspended micro-ring resonators in silicon-on-insulator", *Optics Express*, Vo. 14, No. 13. Jun. 26, 2006, 6259-6263.

Merriam-Webster, "Collegiate Dictionary", *tenth edition* 2000, 2 pages, definition of "frame", p. 462.

Navas, J. et al., "Miniaturised Battery Charger using Piezoelectric Transformers", *IEEE* 2001, 492-496.

Ng, J. et al., "The Diffusion Ion-Implanted Boron in Silicon Dioxide", *AIP Conf. Proceedings*, No. 122 1984, 20-33.

Ohta, S. et al., "Temperature Characteristics of Solidly Mounted Piezoelectric Thin Film Resonators", *IEEE Ultrasonics Symposium*, Honolulu, HI Oct. 2003, 2011-2015.

Pandey, et al., "Anchor Loss Reduction in Resonant MEMS using MESA Structures", *Proceedings of the 2nd IEEE International Conference on Nano/Micro Engineered and Molecular Systems*, Bangkok, Thailand Jan. 16-19, 2007, 880-885.

Pang, W. et al., "High Q Single-Mode High-Tone Bulk Acoustic Resonator Integrated With Surface-Machined FBAR Filter", *Microwave Symposium Digest, IEEE MTT-S International* 2005, 413-416.

Parker, T. E. et al., "Temperature-Compensated Surface Acoustic-Wave Devices with SiO2 Film Overlays", *J. Appl. Physics*, vol. 50 1360-1369, Mar. 1979.

Pensala, et al., "Spurious resonance supression in gigahertz-range ZnO thin-film bulk acoustic wave resonators by the boundary frame method: modeling and experiment", *IEEE Transactions on Ultrasonics, Ferroelectrics, and Frequency Control*, vol. 56, No. 8 Aug. 2009, 1731-1744.

Pensala, "Thin film bulk acoustic wave devices: performance optimization and modeling" http://www.vtt,fi/inf/pdf/publications/2011/P756.pdf.

Reinhardt, Alexandre et al., "Design of Coupled Resonator Filters Using Admittance and Scattering Matrices", *2003 IEEE Ultrasonics Symposium* May 3, 2003, 1428-1431.

Ruby, R. C., "MicroMachined Thin Film Bulk Acoustic Resonators", *IEEE International Frequency Control Symposium* 1994, 135-138.

Ruby, R. et al., "The Effect of Perimeter Geometry on FBAR Resonator Electrical Performance", *Microwave Symposium Digest, 2005 IEEE MTT-S International* Jun. 12, 2005, 217-221.

Sanchez, A.M. et al., "Mixed Analytical and Numerical Design Method for Piezoelectric Transformers", *IEEE Xplore* 2003, 841-846.

Schoenholz, J.E. et al., "Plasma-Enhanced Deposition of Silicon Oxynitride Films", *Thin Solid Films* 1987, 285-291.

Schuessler, Hans H., "Ceramic Filters and Resonators", *Reprinted from IEEE Trans. Sonics Ultrason.*, vol. SU-21 Oct. 1974, 257-268.

Shirakawa, A. A. et al., "Bulk Acoustic Wave Coupled Resonator Filters Synthesis Methodology", *2005 European Microwave Conference*, vol. 1 Oct. 2005.

Small, M. K. et al., "A De-Coupled Stacked Bulk Acoustic Resonator (DSBAR) Filter with 2 dB Bandwidth >4%", *2007 IEEE Ultrasonics Symposium* Oct. 2007, 604-607.

Spangenberg, B. et al., "Dependence of the Layer Resistance of Boron Implantation in Silicon and the Annealing Conditions", *Comptus Rendus de l'Academic Bulgare des Sciences*,vol. 33, No. 3 1980, 325-327.

Tas, et al., "Reducing Anchor Loss in Micromechanical Extensional Mode Resonators", *IEEE Transactions on Ultrasonics, Ferroelectrics and Frequency Control*, vol. 57 No. 2. Feb. 2010, 448-454.

Thomsen, C. et al., "Surface Generation and Detection of Phonons by Picosecond Light Pulses", *Phys. Rev. B*. vol. 34 1986, 4129.

Tiersten, H. F. et al., "An Analysis of Thickness-Extensional Trapped Energy Resonant Device Structures with Rectangular Electrodes in the Piezoelectric Thin Film on Silicon Configuration", *J. Appl. Phys.* 54 (10) Oct. 1983, 5893-5910.

Topich, J. A. et al., "Effects of Ion Implanted Fluorine in Silicon Dioxide", *Nuclear Instr. and Methods, Cecon Rec*, Cleveland, OH May 1978, 70-73.

Tsubbouchi, K. et al., "Zero Temperature coefficient Surface Acoustic Wave Devices using Epitaxial AlN Films", *IEEE Ultrasonic symposium*, San Diego, CA, 1082 1982, 240-245.

Vasic, D et al., "A New Method to Design Piezoelectric Transformer Used in MOSFET & IGBT Drive Circuits", *IEEE 34th Annual Power Electronics Specialists Conference* 2003 vol. 1 Jun. 15-19, 2003, 307-312.

Vasic, D et al., "A New MOSFET & IGBT Gate Drive Insulated by a Piezoelectric Transformer", *IEEE 32 nd Annual Power Electronics Specialists Conference*, 2001 vol. 3 2001, 1479-1484.

Yanagitani, et al., "Giant Shear Mode Electromechanical Coupling Coefficient k15 in C-Axis Tilted ScAlN Films", *IEEE International Ultrasonics Symposium* 2010.

Yang, C.M. et al.,"Highly C Axis Oriented AlN Film Using MOCVD for 5GHx Band FBAR Filter", *2003 IEEE Ultrasonics Symposium* Oct. 5, 2003, pp. 170-173.

Co-pending U.S. Appl. No. 12/710,640, filed Feb. 23, 2010.

Co-pending U.S. Appl. No. 13/074,094, filed Mar. 29, 2011.

Allaha, Mohamed A., "Solid Mounted BAW Resonators With Layer-Transferred AlN Using Sacrificial Si Surfaces", *Solid State Electronics, ESSDERC 2009 Conference*, vol. 54, Issue (Sep. 2010, 1041-1046.

Dubois, M A., "Solidl Mounted Resonator Based on Aluminum Nitride Thin Film", *1998 IEEE Ultrasonics Symposium*, vol. 1 1998, 909-912.

Strijbos, R., "Design and Characterisation of High-Q Solidly-Mounted Bulk Acoustic Wave Filters", *ECTC '07. Proceedings. 57th Electronic Components and Technology Conference*, Publication Year 2007 2007, 169-174.

Ohara, et al. "Suppression of Acoustic Energy Leakage in FBARs with Al Bottom Electrode: FEM Stimulation and Experimental Results", 2007 IEEE Ultrasonics Symposium, Oct. 28-31, 2007, pp. 1657-1660.

IEEE Xplore Abstract for "Suppression of Acoustic Energy Leakage in FBARs with Al Bottom Electrode: FEM Stimulation and Experimental Results", Oct. 28-31, 2007, 2 pages.

Machine Translation of JP 2008-211394, published Sep. 11, 2008, pp. 1-8.

Machine Translation of JP 2007-208845, published Aug. 16, 2007, pp. 1-9.

Co-pending U.S. Appl. No. 14/191,771, filed Feb. 27, 2014.

Co-pending U.S. Appl. No. 14/192,599, filed Feb. 27, 2014.

Machine translation of JP 2006-186412, published Jul. 13, 2006.

Machine Translation of CN1845453A, published Oct. 11, 2006, 22 pages.

Machine Translation of CN101645699A, published Feb. 10, 2010, 32 pages.

Machine Translation of CN101931380A, published Dec. 29, 2010, 25 pages.

(56) References Cited

OTHER PUBLICATIONS

Office Action mailed Mar. 9, 2015 in Chinese Patent Application No. 201210195961.3 (Unofficial/Non-certified translation provided by foreign agent included).
Machine Translation of JP2008-66792, published Mar. 21, 2008, 25 pages.
Machine Translation of JP2003/124779, published Apr. 25, 2005.
Machine Translation of JP2003-017974, published Jan. 17, 2003.
Machine Translation of JP2003-332872, published Nov. 21, 2003.
Machine Translation of JP2003-505905, published Feb. 12, 2003.
Machine Translation of WO2004/034579, published Apr. 22, 2004.
Machine Translation of JP2005-159402, published Jun. 16, 2005.
Machine Translation of JP2006-109472, published Apr. 20, 2006.
Machine Translation of JP2006-295924, published Oct. 26, 2006.
Machine Translation of JP2006-319796, published Nov. 24, 2006.
Machine Translation of JP2007/028669, published Feb. 1, 2007.
Machine Translation of JP2007-006501, published Jan. 11, 2007.
Machine Translation of JP2007-295306, published Nov. 1, 2007.
Machine Translation of JP2008-131194, published on Jun. 5, 2008.
Machine Translation of FR2951027, published on Apr. 8, 2011.
Kazinczi, et al., "Reliability Issues on MEMS Resonators", Delft University of Technology, DIMES; Faculty of Information Technology and Systems; Department of Electrical Engineering; Laboratory of Electronics Instrumentation, Mekelweg 4, 2628 CD Delft, the Netherlands.
Murphy, et al., "Normal and Inverted Algan/Gan Based Piezoelectric Field Transistors Grown by Plasma Induced Molecular Beam Epitaxy", MRS Internet Nitride Semicond. Res. 4S1, G8.4, 1999
Paranjpe, et al., "Atomic Layer Deposition of AlOx for Thin Film Head Gap Applications", Journal of the Electrochemical Society, 148 G465-G471, 2001.
Co-pending U.S. Appl. No. 13/662,460, filed Oct. 27, 2012.
Co-pending U.S. Appl. No. 13/906,873, filed May 31, 2013.
Co-pending U.S. Appl. No. 14/161,564, filed Jan. 22, 2014.
Harper Collins Publishers, "Definitions of "within" from "Collins English Dictionary-Complete and Unabridge"" Copyright 1991, 1994, 1998, 2000, 2003 and "Random Kernerman Webster's College Dictionary", 2010 K Dictionaries Ltd. copyright 2005, 1997, 1991 by Random House, Inc. as found online at www.thefreedictionary.com, one page.
Machine Translation of WO02103900, published Dec. 27, 2002.
Machine Translation of WO03030358, published Apr. 10, 2003.
Machine Translation of WO03043188, published May 22, 2003.
Machine Translation of WO03050950, published Jun. 19, 2003.
Machine Translation of CN101170303, published Apr. 30, 2008.
Machine Translation of DE10160617, published Jun. 12, 2003.
Machine Translation of DE102007012384, published Sep. 18, 2008.
Machine Translation of DE10239317, published Mar. 11, 2004.
Machine Translation of JP10308645, published Nov. 17, 1998.
Machine Translation of JP2000232334, published Aug. 22, 2000.
Machine Translation of JP2000-295065, published Oct. 20, 2000.
Machine Translation of JP2000-31552; published Jan. 28, 2000.
Machine Translation of JP2000-332568, publish Nov. 30, 2000.
Machine Translation of JP2001-102901, published Apr. 13, 2001.
Machine Translation of JP2001-508630, published Jun. 26, 2001.
Machine Translation of JP2002/217676, published Aug. 2, 2002.
Picosun Atomic Layer Deposition—The basic principles, film materials, and applications.
Puurunen, "Preparation by Atomic Layer Deposition and Characterisation of Catalyst Supports Surfaced with Aluminum Nitride", Dissertation for the Degree of Doctor of Science in Technology, Helsinki University of Technology, Espoo, Finland. Oct. 25, 2002.
Stutzman, et al., "Playing with Polarity", Phys. Stat. Sol. (b) 228, No. 2., pp. 505-512, 2001.
Machine Translation of EP0689254, published Dec. 27, 1995.
Machine Translation of WO99/37023, published Jul. 22, 1999.
Co-pending U.S. Appl. No. 12/891,039, filed Sep. 27, 2010.
Co-pending U.S. Appl. No. 13/161,946, filed Jun. 16, 2011.
Co-pending U.S. Appl. No. 13/162,883.
Ambacher, "Growth and Applications of Group III-Nitrides", J. Phys. D: Appl. Phys. 31, pp. 2653-2710. 1998.
Dalmau, et al., "AlN Bulk Crystals Grown on CiC seeds", Journal of Crystal Growth, 281, pp. 68-74, 2005.

\* cited by examiner

FILM BULK ACOUSTIC RESONATOR COMPRISING A BRIDGE

CROSS-REFERENCE TO RELATED APPLICATIONS

This application is a continuation-in-part application of commonly owned U.S. patent application Ser. No. 13/074,262 to Dariusz Burak, entitled "Stacked Acoustic Resonator Comprising a Bridge," filed on Mar. 29, 2011, which is a continuation-in-part of commonly owned U.S. patent application Ser. No. 13/036,489 to Dariusz Burak, entitled "Coupled Resonator Filter Comprising Bridge" filed on Feb. 28, 2011. The present application claims priority under 35 U.S.C. §120 to U.S. patent application Ser. Nos. 13/074,262 and 13/036,489, the disclosures of which are hereby incorporated by reference in their entirety.

BACKGROUND

Transducers generally convert electrical signals to mechanical signals or vibrations, and/or mechanical signals or vibrations to electrical signals. Acoustic transducers, in particular, convert electrical signals to acoustic waves and acoustic waves to electrical signal using inverse and direct piezo-electric effects. Acoustic transducers generally include acoustic resonators, such as thin film bulk acoustic resonators (FBARs), surface acoustic wave (SAW) resonators or bulk acoustic wave (BAW) resonators, and may be used in a wide variety of electronic applications, such as cellular telephones, personal digital assistants (PDAs), electronic gaming devices, laptop computers and other portable communications devices. For example, FBARs may be used for electrical filters and voltage transformers. Generally, an acoustic resonator has a layer of piezoelectric material between two conductive plates (electrodes), which may be formed on a thin membrane. FBAR devices, in particular, generate acoustic waves that can propagate in all possible lateral directions when stimulated by an applied time-varying electric field, as well as higher order harmonic mixing products. The laterally propagating modes and the higher order harmonic mixing products may have a deleterious impact on functionality.

In FBAR devices, mitigation of acoustic losses at the boundaries and the resultant mode confinement in the active region of the FBAR (the region of overlap of the top electrode, the piezoelectric layer, and the bottom electrode) has been effected through various methods. For example, frames are provided along one or more sides of the FBARs. The frames create an acoustic impedance mismatch that reduces losses by reflecting desired modes back to the active area of the resonator, thus improving the confinement of desired modes within the active region of the FBAR. However, better acoustic energy confinement, as well as further improvements in FBAR Q-factor due to the better acoustic energy confinement, are needed for increased efficiency of FBARs.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

Figure 1A:
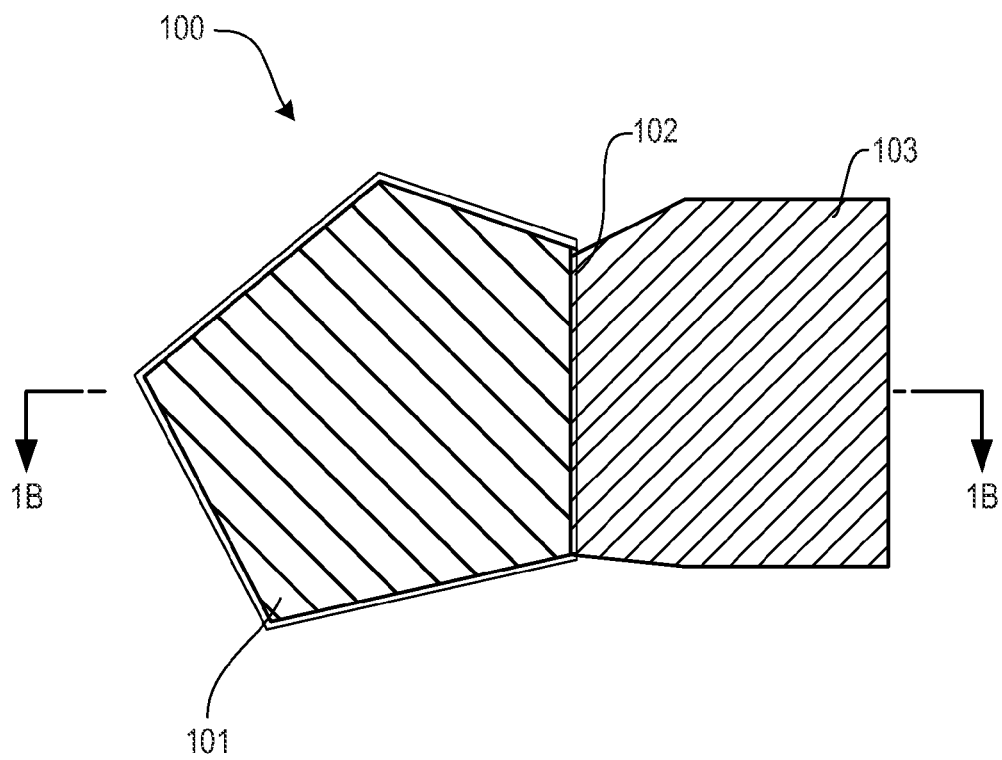
FIG. 1A shows a top-view of an FBAR in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The present teachings relate generally to BAW resonator structures comprising FBARs. In certain applications, the BAW resonator structures provide FBAR-based filters (e.g., ladder filters). Certain details of FBARs and/or BAW resonators and resonator filters, materials thereof and their methods of fabrication may be found in one or more of the following commonly owned U.S. Patents and Patent Applications: U.S. Pat. No. 6,107,721 to Lakin; U.S. Pat. Nos. 5,587,620, 5,873, 153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. Patent App. Pub. No. 2010/0327697 to Choy et al.; and U.S. Patent App. Pub. No. 2010/0327994 to Choy et al. The disclosures of these patents and patent applications are specifically incorporated herein by reference. It is emphasized that the components, materials and method of fabrication described in these patents and patent applications are representative and other methods of fabrication and materials within the purview of one of ordinary skill in the art are contemplated.

FIG. 1A shows a top view of FBAR 100 in accordance with a representative embodiment. The FBAR 100 includes a top electrode 101 having five (5) sides, with a connection side 102 configured to provide an electrical connection to interconnect 103. The interconnect 103 provides electrical signals to the top electrode 101 to excite desired acoustic waves in a piezoelectric layer (not shown in FIG. 1A) of the FBAR 100.

Figure 1B:
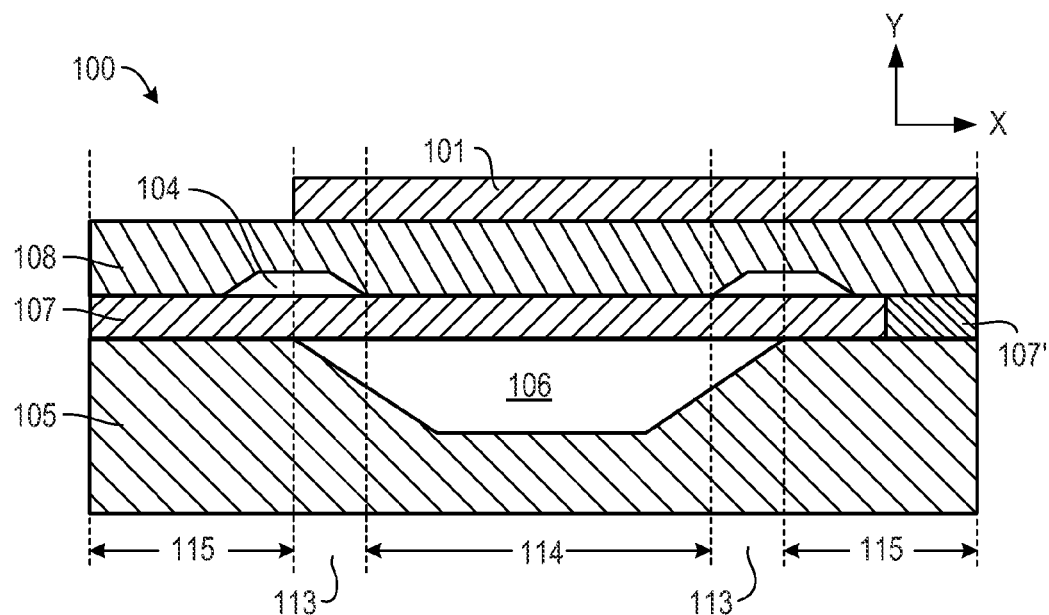
FIG. 1B is a cross-sectional view of the FBAR of FIG. 1A, taken along the line 1B-1B.

FIG. 1B shows a cross-sectional view of the FBAR 100 taken along line 1B-1B in accordance with a representative embodiment. The FBAR 100 includes multiple layers stacked over substrate 105 having a cavity 106. The inclusion of a cavity 106 for reflection of acoustic waves in the FBAR 100 is merely illustrative. In various alternative configurations, a known acoustic reflector (e.g., a Bragg mirror (not shown)) comprising alternating layers of high and low acoustic impedance may be provided in the substrate 105 to provide acoustic isolation in place of the cavity 106, without departing from the scope of the present teachings.

A first or bottom electrode 107 is disposed over the substrate 105 and over the cavity 106 (or Bragg mirror). A planarization layer 107' is also provided over the substrate as shown. In a representative embodiment, the planarization layer 107' includes non-etchable borosilicate glass (NEBSG), for example. In general, planarization layer 107' does not need to be present in the structure (as it increases overall processing cost), but when present, it may improve quality of growth of subsequent layers and simplify their processing. A piezoelectric layer 108 is disposed over the bottom electrode 107, and a second or top electrode 101 (shown in FIG. 1A) is disposed over the piezoelectric layer 108. As should be appreciated by one of ordinary skill in the art, the structure provided by the bottom electrode 107, the piezoelectric layer 108 and the top electrode 101 is a bulk acoustic wave (BAW) resonator. When the BAW resonator is disposed over a cavity, it is a so-called FBAR (e.g., FBAR 100); and when the BAW resonator is disposed over an acoustic reflector (e.g., Bragg mirror), it is a so-called solidly mounted resonator (SMR). The present teachings contemplate the use of either FBARs or SMRs in a variety of applications, including filters (e.g., ladder filters comprising a plurality of BAW resonators).

In the depicted embodiment, a bridge 104 is buried between the bottom electrode 107 and the piezoelectric layer 108. The bridge 104 is disposed along all sides of the FBAR 100 (i.e., along a perimeter of the FBAR 100). For example, in representative embodiments, the bridge 104 (and other bridges described in connection with representative embodiments below) has a trapezoidal cross-sectional shape. It is emphasized that the trapezoidal cross-sectional shape of the bridge of the representative embodiments is merely illustrative and the bridges are not limited to a trapezoidal cross-sectional shape. For example, the cross-sectional shape of the bridges of the representative embodiments could be square or rectangular, or of an irregular shape. The "slanting" walls of bridge 104 (and other bridges described in connection with representative embodiments below) are beneficial to the quality of layers (e.g., the quality of the crystalline piezoelectric layer(s)) grown over the bridge 104 (and other bridges described in connection with representative embodiments below). Typical dimensions of the bridge 104 (and other bridges described in connection with representative embodiments below) are approximately 2.0 μm to approximately 10.0 μm in width (x-dimension in the coordinate system shown in FIG. 1B) and approximately 300 Å to approximately 1500 Å in height (y-dimension in the coordinate system shown in FIG. 1B).

In certain embodiments, the bridge 104 (and other bridges described in connection with representative embodiments below) extends over the cavity 106 (depicted as overlap 113 in FIG. 1B). The overlap 113 (also referred to as the decoupling region) has a width (x-dimension) of approximately 0.0 μm (i.e., no overlap with the cavity 106) to approximately 10.0 μm. Generally, optimum width of the bridge 104 (and other bridges described in connection with representative embodiments below) depends on the reflection of the eigen-modes at the boundary of an active region 114 (also referred to herein as an FBAR region) and a decoupling region (i.e., the overlap 113). Due to the smaller thickness of layers in the decoupling region 113 only complex evanescent modes for the thickness-extensional motion can exist at the operating frequency of the FBAR 100. These complex evanescent modes are characterized by a characteristic decay length and by a specific propagation constant. The bridge 104 needs to be wide enough to ensure suitable decay of complex evanescent waves excited at the boundary of FBAR region 114 and the decoupling region 113. Wide bridges allow to minimize tunneling of energy into a field region 115 where propagating modes exist at the frequency of operation. On the other hand, if the bridge 104 is too wide, reliability issues can arise and can also limit the placement of similar FBARs (not shown) from being placed in proximity (thus unnecessary increasing the total area of a chip). In practical situations the propagating component of the complex evanescent wave can be used to find the optimum width of the bridge 104. In general, when the width of bridge 104 is equal to an odd multiple of the quarter-wavelength of the complex evanescent wave, the reflectivity of the eigen-modes can be further increased which can be manifested by Rp and Q attaining maximum values. Typically, depending on the details of the excitation mechanism, other propagating modes of the decoupling region 113, such as shear modes and flexural modes, can impact Rp and Q. The width of the bridge 104 can be modified in view of these other propogating modes. Such optimum width of the bridge 104 may be determined experimentally.

In addition, the width and position of the bridge 104 (and other bridges described in connection with representative embodiments) and the amount of the overlap 113 with the cavity 106 are selected to improve Q-factor enhancement of the resonant piston mode, referred to as the Q-factor (Q). In general, the greater the overlap 113 of the bridge 104 with the cavity 106 of the FBAR 100, the greater the improvement in the Q-factor, with the improvement realized being fairly small after an initial increase. The improvement in the Q-factor must be weighed against a decrease in the electromechanical effective coupling coefficient $kt^2$, which decreases with increasing overlap 113 of the bridge 104 with the cavity 106. Degradation of $kt^2$ results in a degradation of insertion loss ($S_{21}$) of a filter comprising FBARs. As such, the overlap 113 of the bridge 104 with the cavity 106 may be optimized experimentally.

The bridge 104 (and other bridges described in connection with representative embodiments below) has a height (y-dimension in the coordinate system of FIG. 1B) of approximately 300 Å to approximately 1500 Å. Notably, the lower limit of the height is determined by the limits of the process of releasing sacrificial material in the forming of the bridge 104 (and other bridges described in connection with representative embodiments below), and the upper limit of the height is determined by the quality of layers grown over the bridge 104 (and other bridges described in connection with representative embodiments) and by the quality of subsequent processing of possibly non-planar structures.

Illustratively, the bottom electrode 107 and top electrode 101 are formed of tungsten (W) having a thickness of approximately 1000 Å to approximately 10000 Å. Other materials may be used for the bottom electrode 107 and the top electrode 101, including but not limited to molybdenum (Mo) or a bimetal material. Illustratively, the piezoelectric layer 108 is formed of aluminum nitride (AlN) having a thickness of approximately 5000 Å to approximately 25000 Å. Other materials may be used for the piezoelectric layer 108, including but not limited to zinc oxide (ZnO). The bridge 104 may be formed by patterning a sacrificial material over the bottom electrode 107, and forming the depicted layer thereover. After the layers of the FBAR 100 are formed as desired, the sacrificial material is released leaving the bridge 104 "unfilled" (i.e., containing or filled with air). In a representative embodiment, the sacrificial material used to form the bridge 104 is the same as the sacrificial material used to form the cavity 106, such as phosphosilicate glass (PSG), for example.

In a representative embodiment, the bridge 104 defines a perimeter along the active region 114 of the FBAR 100. The active region 114 thus includes the portions of the acoustic resonator disposed over the cavity 106 and bounded by the perimeter provided by the bridge 104. As should be appreciated by one of ordinary skill in the art, the active region of the FBAR 100 is bordered around its perimeter by an acoustic impedance discontinuity created at least in part by the bridge 104, and above and below (cavity 106) by an acoustic impedance discontinuity due to the presence of air. Thus, a resonant cavity is beneficially provided in the active region of the FBAR 100. In the depicted embodiment, the bridge 104 is unfilled (i.e., contains air), as is the cavity 106. In other embodiments, the bridge 104 is "filled" (i.e., contains a dielectric or metal material to provide the desired acoustic impedance discontinuity) to provide bridge 104', described more fully below with reference to FIG. 1C. It is noted that the bridge 104 does not necessarily have to extend along all edges of the FBAR 100, and therefore not along the perimeter of the FBAR 100. For example, the bridge 104 may be provided on four "sides" of the five-sided FBAR 100 shown in FIG. 1A.

The acoustic impedance mismatch provided by the bridge 104 causes reflection of acoustic waves at the boundary that may otherwise propagate out of the active region and be lost, resulting in energy loss. The bridge 104 serves to confine the modes of interest within the active region 114 of the FBAR 100 and to reduce energy losses in the FBAR 100. Reducing such tosses serves to increase the Q-factor of the FBAR 100. In filter applications of the FBAR 100, as a result of the reduced energy loss, the insertion loss ($S_{21}$) is beneficially improved.

Figure 1C:
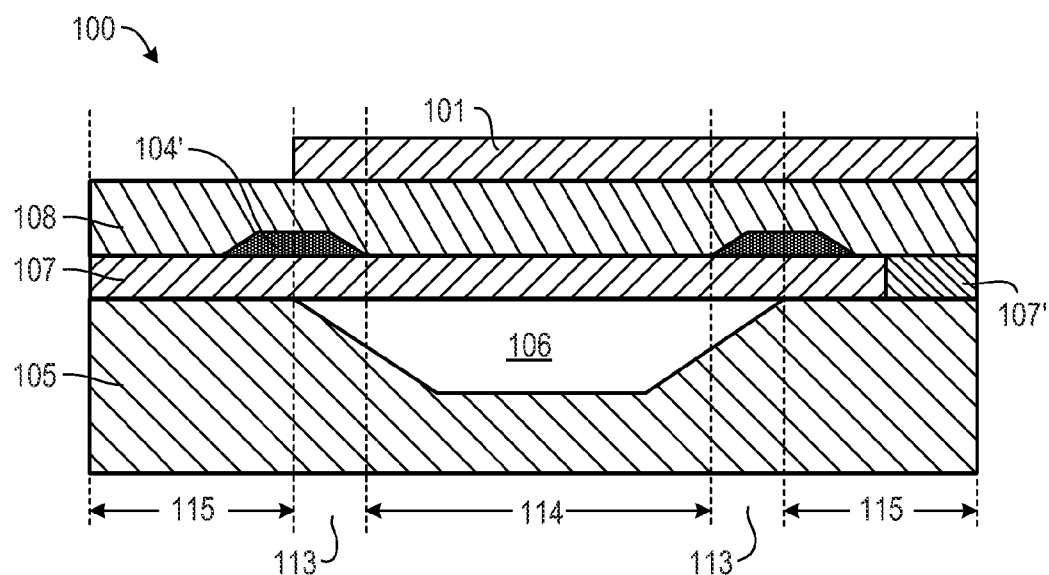
FIG. 1C is a cross-sectional view of an FBAR in accordance with another representative embodiment.

In the representative embodiment shown and described in connection with FIGS. 1A and 1B, the bridge 104 is unfilled (i.e., contains air as the acoustic medium). FIG. 1C shows a cross-sectional view of FBAR 100 in which the bridge is "filled" with a material having an acoustic impedance in order to provide significantly large lateral acoustic impedance discontinuity at the boundary between FBAR region 114 and decoupling region 113. The mechanism of reducing losses in the filled bridge 104' relies on suppression and confinement of the propagating eigen-modes which are electrically excited in the FBAR region 114 as a part of piston mode excitation. Both ends of the filled bridge 104' provide mechanical discontinuities allowing to control the phase of the reflected mode and provide overall beneficial suppression of the propagating eigen-modes in the main FBAR region 114. In certain embodiments, bridge 104' is filled with NEBSG, carbon doped oxide (CDO), silicon carbide (SiC) or other suitable dielectric material that will not release when the sacrificial material disposed in the cavity 106 is released. In another embodiments bridge 104' is filled with one of tungsten (W), molybdenum (Mo), copper (Cu) or iridium (Ir). The bridge 104' is fabricated by forming the NEBSG or other material over the bottom electrode 107 by a known method, and forming the piezoelectric layer 108 and the top electrode 101 of the FBAR 100 thereover. When the cavity 106 is formed through the release of the sacrificial, the bridge 104' remains filled with the selected material.

Figure 2:
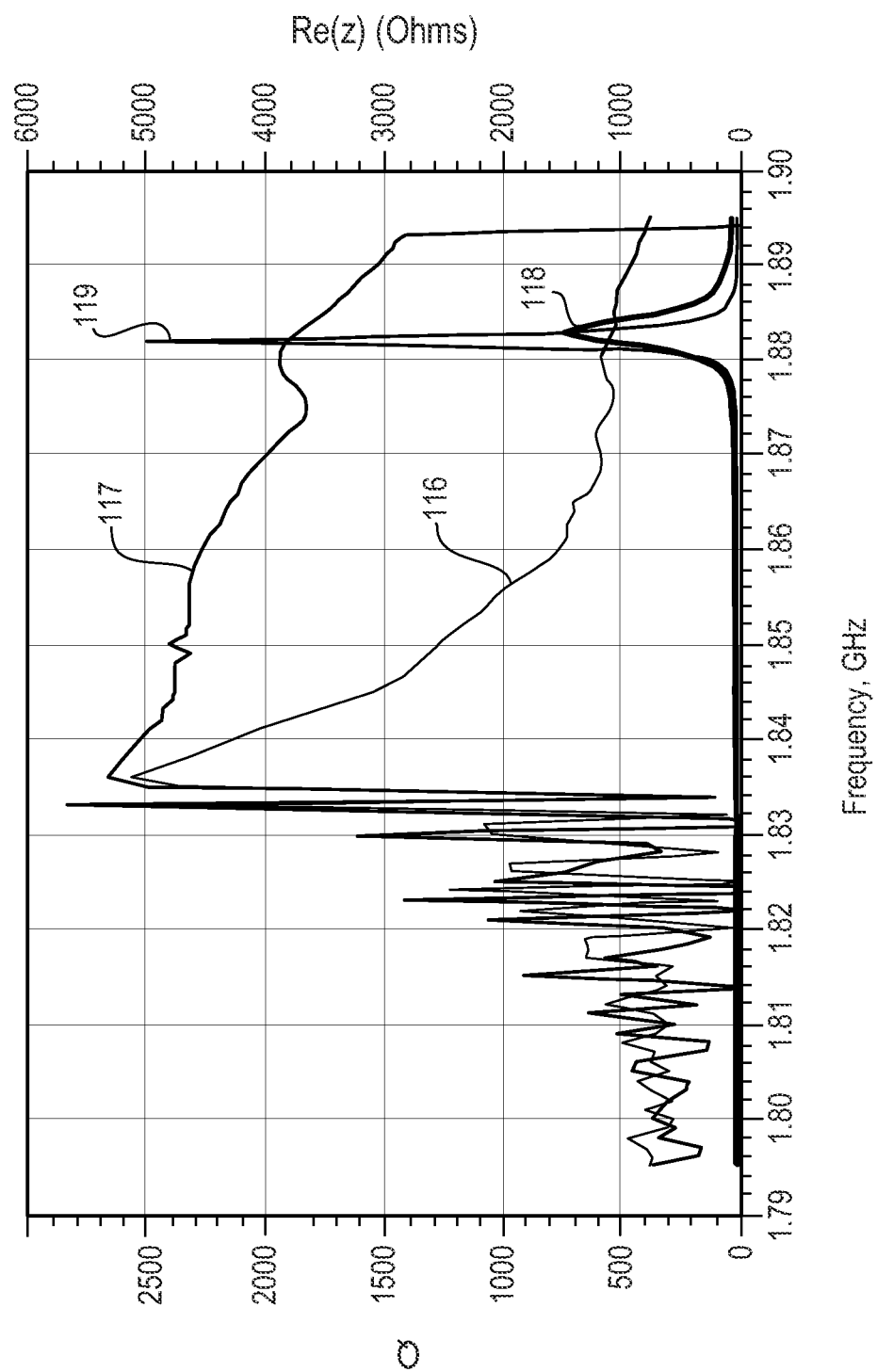
FIG. 2 is a graphical comparison of Q-factors (Q) of a conventional FBAR and an FBAR in accordance with a representative embodiment.

FIG. 2 shows a comparison of simulated Q-factor versus frequency of FBAR 100 of the representative embodiment depicted in FIG. 1B, and the Q-factor of a conventional FBAR (without a bridge). As shown in FIG. 1B, the bridge 104 is released. For purposes of illustration of the improvement in mode confinement in the active region 114 of the FBAR 100, the bridge 104 has a width (x-dimension) of approximately 5.0 μm, a height of 2000 Å, and an overlap 113 of approximately 2.0 μm. Curve 116 depicts the Q-factor of a conventional FBAR (without a bridge), and curve 117 depicts the Q-factor of an FBAR 100 with the bridge 104 released. The corresponding values of the Q-factors are shown on the left vertical axis. Compared to the conventional FBAR that does not include a bridge, an increase in the Q-factor of up to approximately 350% (depending on frequency of operation, e.g., at 1.88 GHz) is expected.

Also shown in FIG. 2 is a comparison of the (simulated) real part of electrical impedance Re[Z] of FBAR 100 of the representative embodiment depicted in FIG. 1B, and the real part of electrical impedance Re[Z] of a conventional FBAR (without a bridge). The peak location of the real part of electrical impedance Re[Z] indicates parallel resonance frequency Fp of a given FBAR, while the peak value of the real part of electrical impedance Re[Z] indicates parallel resistance Rp of a given FBAR. Curve 118 depicts the real part of electrical impedance Re[Z] of a conventional FBAR (without a bridge), where the peak location is at about 1.88 GHz and the peak value is about 1500 ohms. Curve 119 depicts the real part of electrical impedance Re[Z] of an FBAR 100 with the bridge 104 released, as shown in FIG. 1B, where the peak location is at about 1.88 GHz and the peak value is about 5000 ohms. The corresponding values of the real part of the electrical impedance Re[Z] are shown on the right vertical axis. Thus, compared to the conventional FBAR that does not include a bridge, an increase in the parallel resistance Rp of approximately 400% is expected in the FBAR 100 including the bridge 104.

Figure 3A:
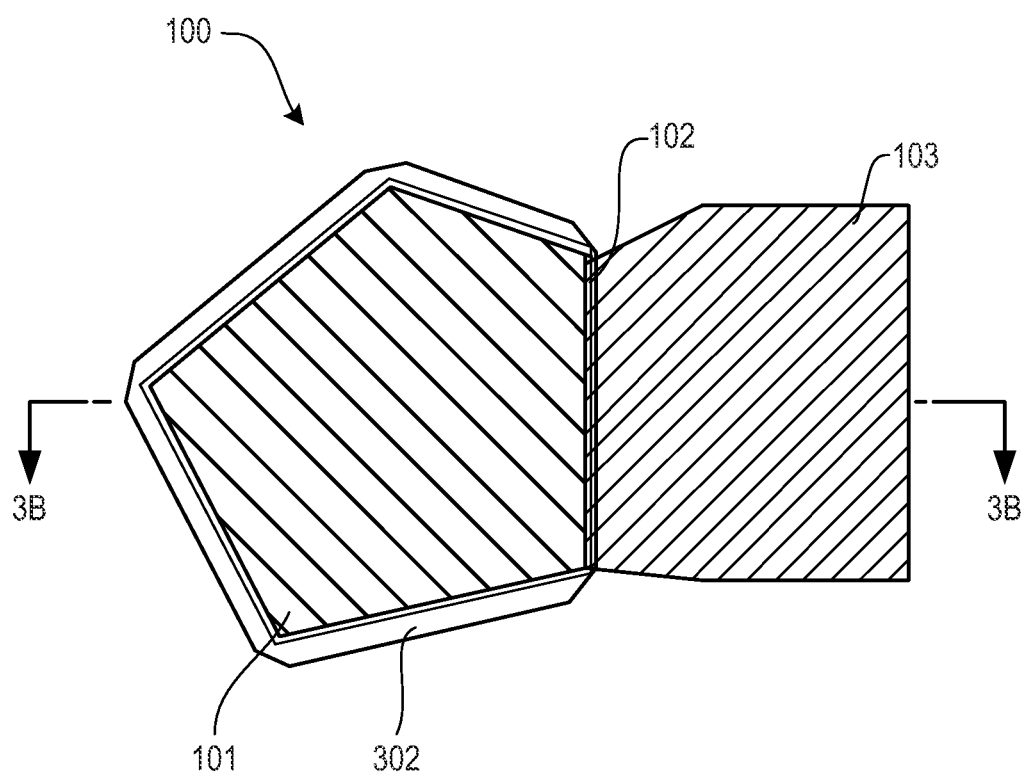
FIG. 3A shows a top-view of an FBAR in accordance with a representative embodiment.

FIG. 3A shows a top view of FBAR 300 in accordance with a representative embodiment. Similar to the FBAR 100 shown in FIG. 1A, the FBAR 300 includes the top electrode 101 having five (5) sides, with the connection side 102 configured to provide an electrical connection to the interconnect 103. The interconnect 103 provides electrical signals to the top electrode 101 to excite desired acoustic waves in a piezoelectric layer (not shown in FIG. 3A) of the FBAR 300. In addition, the top electrode 101 of the FBAR 300 includes a second bridge 302 disposed on all sides (the bridge on the connection side 102 cannot be seen in the top view of FIG. 3A). As described more fully below, providing the second bridge 302 about the perimeter of the FBAR 300 contributes to improved insertion loss and the Q-factor over a desired frequency range (e.g., a passband of the FBAR).

Figure 3B:
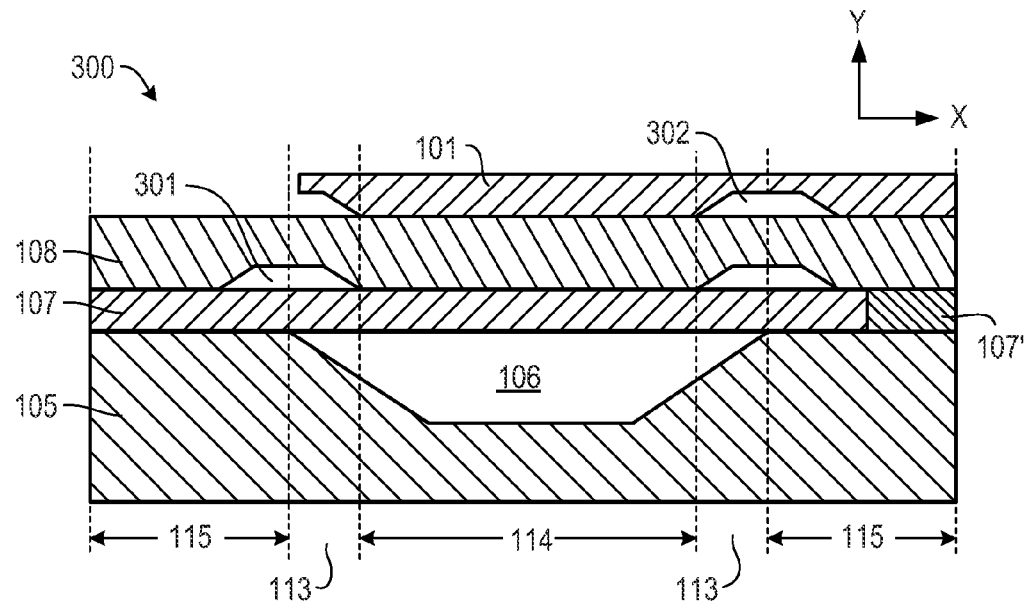
FIG. 3B is a cross-sectional view of the FBAR of FIG. 1A, taken along the line 3B-3B.

FIG. 3B shows a cross-sectional view of the FBAR 300 taken along line 3B-3B in accordance with a representative embodiment. The FBAR 300 includes multiple layers stacked over substrate 105 having a cavity 106 (or Bragg mirror). In particularly, a bottom electrode 107 is disposed over the substrate 105 and over the cavity 106 (or Bragg mirror). A bottom-electrode planarization layer 107' is also (optionally) provided over the substrate as shown, which may include NEBSG, for example. A piezoelectric layer 108 is disposed over the bottom electrode 107, and the top electrode 101 is disposed over the piezoelectric layer 108. As discussed above, the structure provided by the bottom electrode 107, the piezoelectric layer 108 and the top electrode 101 forms a BAW resonator.

In the depicted embodiment, a first bridge 301 is provided between the bottom electrode 107 and the piezoelectric layer 108, and a second bridge 302 is provided between the piezoelectric layer 108 and the top electrode 101. Each of the first and second bridges 301, 302 is disposed along all sides of the FBAR 300 (i.e., along a perimeter of the FBAR 300). For example, in representative embodiments, the first and second bridges 301, 302 (and other bridges described in connection with representative embodiments below) have a trapezoidal cross-sectional shape. However, as discussed above, the trapezoidal cross-sectional shape of the bridges of the representative embodiments is merely illustrative and the bridges are not limited to a trapezoidal cross-sectional shape. Notably, the first bridge 301 and the second bridge 302 (and other bridges described in connection with representative embodiments below) are not necessarily the same shape (e.g., one could have trapezoidal cross-sectional shape and one could have rectangular cross-sectional in shape). Typical dimensions of the first and second bridges 301, 302 (and other bridges described in connection with representative embodiments below) are approximately 2.0 µm to approximately 10.0 µm in width (x-dimension in the coordinate system shown in FIG. 3B) and approximately 300 Å to approximately 1500 Å in height (y-dimension in the coordinate system shown in FIG. 3B).

In certain embodiments, the first and second bridges 301, 302 (and other bridges described in connection with representative embodiments below) extend over the cavity 106 (depicted as overlap 113 in FIG. 3B). As discussed above, the overlap 113 has a width (x-dimension) of approximately 0.0 µm (i.e., no overlap with the cavity 106) to approximately 10.0 µm. Notably, the first bridge 301 and the second bridge 302 (and other bridges described in connection with representative embodiments below) do not need to be the same dimensions or located at the same relative position. For example, the overlap 113 is shown in FIG. 3B to be identical for both of the first and second bridges 301, 302. However, this is not essential as different configurations may include one of the first and second bridges 301, 302 overlapping the cavity 106 to a greater or lesser extent than the other one of the first and second bridges 301, 302.

Generally, the first and second bridges 301, 302 need to be wide enough to ensure suitable decay of complex evanescent waves at the boundary of an active region 114 and the decoupling region in order to minimize tunneling of modes into a field region 115 where propagating modes exist at the frequency of operation. Also, similarly as for bridge 104 in FBAR 100, the propagating component of the complex evanescent modes or other propagating mode (like shear and flexural mode) allowed in regions bounded vertically by first and second bridges 301, 302 can be used to increase reflectivity of the eigen-modes FBAR region 114 by selecting the proper width of the bridges. On the other hand, if the first and second bridges 301, 302 are too wide, reliability issues can arise and can also limit the placement of similar FBARs (not shown) from being placed in proximity (thus unnecessary increasing the total area of a chip). As such, the optimum widths of the first and second bridges 301, 302 may be determined experimentally.

In addition, the width and position of the first and second bridges 301, 302 and the overlap 113 with the cavity 106 are selected to improve the Q-factor, as discussed above. In general, the greater the overlap 113 of each of the first and second bridges 301, 302 with the cavity 106 of the FBAR 300, the greater the improvement in the Q-factor with the improvement realized being fairly small after an initial increase. The improvement in the Q-factor must be weighed against a decrease in the electromechanical effective coupling coefficient $kt^2$, which decreases with increasing overlap 113 of the first and second bridges 301, 302 with the cavity 106. Degradation of $kt^2$ results in a degradation of insertion loss ($S_{21}$) of a filter comprising FBARs. As such, the overlap 113 of the first and second bridges 301, 302 with the cavity 106 may be optimized experimentally.

Illustratively, the first and second bridges 301, 302 have a height (y-dimension in the coordinate system of FIG. 3B) of approximately 300 Å to approximately 1500 Å. Notably, the lower limit of the height is determined by the limits of the process of releasing sacrificial material in the forming of the first and second bridges 301, 302, and the upper limit of the height is determined by the quality of layers grown over the first and second bridges 301, 302 and by the quality of subsequent processing of possibly non-planar structures. The first and second bridges 301, 302 may be formed by patterning a sacrificial material over the bottom electrode 107 and the piezoelectric layer 108, respectively, and forming the depicted layers thereover. After the layers of the FBAR 300 are formed as desired, the sacrificial material is released, leaving the first and second bridges 301, 302 unfilled (i.e., containing air). In a representative embodiment, the sacrificial material used to form the first and second bridges 301, 302 is the same as the sacrificial material used to form the cavity 106 (e.g., PSG).

In a representative embodiment, the first bridge 301 and the second bridge 302 define a perimeter along the active region 114 of the FBAR 300. The active region 114 thus includes the portions of the acoustic resonator disposed over the cavity 106 and bounded by the perimeter provided by the first bridge 301 and the second bridge 302. As should be appreciated by one of ordinary skill in the art, the active region of the FBAR 300 is bordered around its perimeter by an acoustic impedance discontinuity created at least in part by the first and second bridges 301, 302, and above and below (cavity 106) by an acoustic impedance discontinuity due to the presence of air. Thus, a resonant cavity is beneficially provided in the active region of the FBAR 300. In certain embodiments, the first bridge 301 and the second bridge 302 are unfilled (i.e., contain air), as is the cavity 106. in other embodiments described more fully below (e.g., with reference to FIGS. 3C-3E), the first bridge 301, the second bridge 302, or both, are filled with a material to provide the desired acoustic impedance discontinuity. In yet other embodiments, parts of the first bridge 301, the second bridge 302, or both, can be filled along some edges of FBAR 300, and can be unfilled (i.e., contain air) along other edges of FBAR 300.

It is noted that the first bridge 301, the second bridge 302, or both, do not necessarily have to extend along all edges of the FBAR 300, and therefore not along the perimeter of the FBAR 300. For example, the first bridge 301, the second bridge 302, or both, may be provided on four "sides" of the five-sided FBAR 300 shown in FIG. 3A. In certain embodiments, the first bridge 301 is disposed along the same four sides of the FBAR 300 as the second bridge 302. In other embodiments, the first bridge 301 is disposed along four sides (e.g., all sides but the connection side 102) of the FBAR 300 and the second bridge 302 is disposed along four sides of the FBAR 300, but not the same four sides as the first bridge 301 (e.g., second bridge 302 is disposed along the connection side 102 in FIG. 3A).

The acoustic impedance mismatch provided by the first bridge 301 and the second bridge 302 causes reflection of acoustic waves at the boundary that may otherwise propagate out of the active region and be lost, resulting in energy loss. The first bridge 301 and the second bridge 302 serve to confine the modes of interest within the active region 114 of the FBAR 300 and to reduce energy losses in the FBAR 300. Reducing such losses serves to increase the Q-factor of the FBAR 300. In filter applications of the FBAR 300, as a result of the reduced energy loss, the insertion loss ($S_{21}$) is beneficially improved.

Figure 3C:
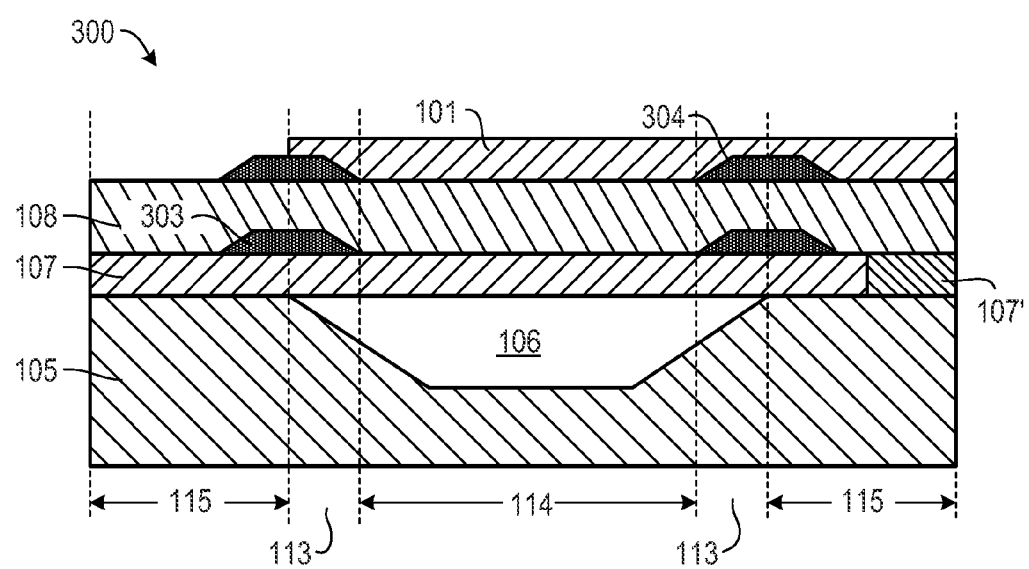
FIG. 3C is a cross-sectional view of an FBAR in accordance with another representative embodiment.

In the representative embodiment shown and described in connection with FIGS. 3A and 3B, the first and second bridges 301, 302 are unfilled (i.e., contain air as the acoustic medium). FIG. 3C shows a cross-sectional view of FBAR 300 in which both bridges are filled with a material to provide the acoustic impedance discontinuity to reduce losses. In certain embodiments, first bridge 303 and second bridge 304 are filled with NEBSG, CDO, SiC, or other suitable dielectric material that will not release when the sacrificial material disposed in the cavity 106 is released. In other embodiments, first bridge 303 and second bridge 304 are filled with one of tungsten (W), molybdenum (Mo), aluminum (Al) or iridium (Ir), or other suitable metal that will not release when the sacrificial material disposed in the cavity 106 is released. The first and second bridges 303, 304 are fabricated by forming the NEBSG or other fill material over the bottom electrode 107 and the piezoelectric layer 108, respectively, by a known method, and forming respective layers of the FBAR 300 (if any) thereover. When the cavity 106 is formed through the release of the sacrificial, the first bridge 303 and the second bridge 304 remain filled with the selected material.

Figure 3D:
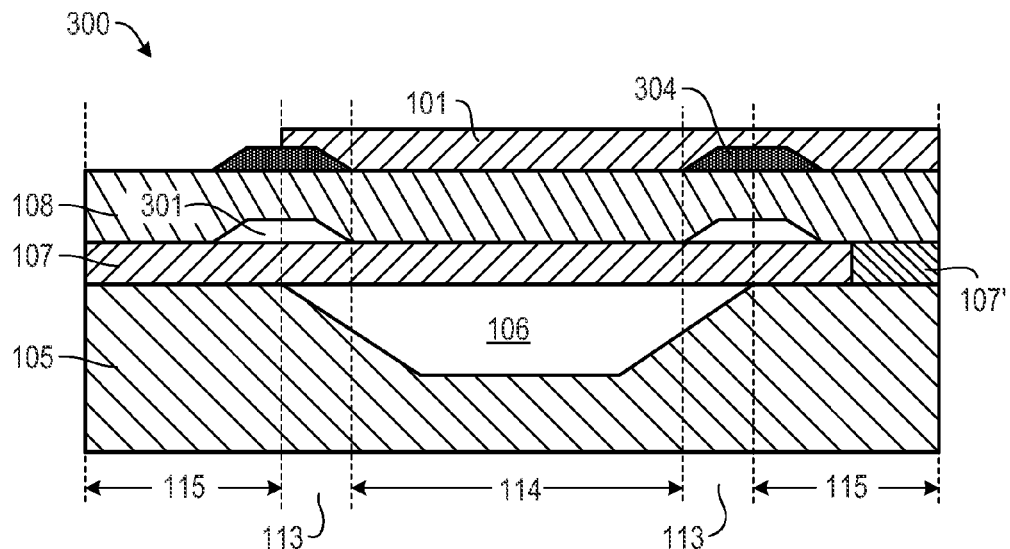
FIG. 3D is a cross-sectional view of an FBAR in accordance with another representative embodiment.

FIG. 3D shows a cross-sectional view of FBAR 300 in which the second bridge 304 is filled with a material to provide the acoustic impedance discontinuity to reduce losses, and the first bridge 301 contains air (unfilled). This modification of the FBAR 300 is fabricated by patterning a material (e.g., NEBSG) over the piezoelectric layer 108 that will not release before forming the top electrode 101. The first bridge 301 is formed by patterning a sacrificial material over the bottom electrode 107, and releasing the sacrificial material as described above.

Figure 3E:
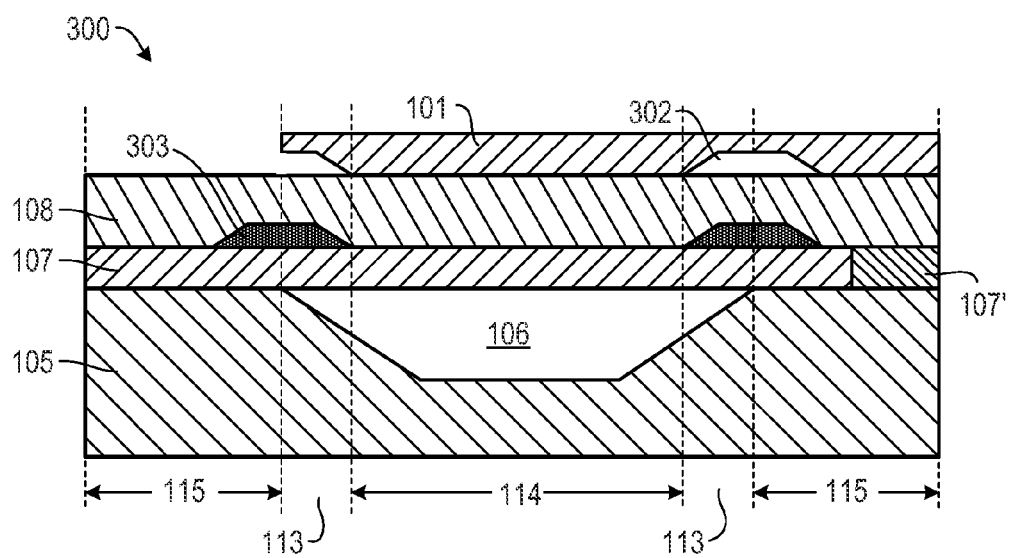
FIG. 3E is a cross-sectional view of an FBAR in accordance with another representative embodiment.

FIG. 3E shows a cross-sectional view of FBAR 300 in which the second bridge 302 contains air, and the first bridge 303 is filled with a material to provide the acoustic impedance discontinuity to reduce losses. This modification of the FBAR 300 is fabricated by patterning a material (e.g., NEBSG) over the bottom electrode 107 that will not release before forming the piezoelectric layer 108. The second bridge 302 is formed by patterning a sacrificial material over the piezoelectric layer 108, and releasing the sacrificial material as described above.

EMBODIMENTS COMPRISING A SINGLE BRIDGE

In the embodiments described presently, a single bridge is provided in an illustrative FBAR. The single bridge is provided at a single layer in each embodiment, and forms a perimeter that encloses the active region of the FBAR. By placing the bridge under different layers, the various embodiments can be studied to test the degree of coupling of modes in the active region (FBAR region) and the modes in the field region. Generally, the bridge decouples modes with a comparatively large propagation constant ($k_r$) from the modes in the field region. As described below, certain embodiments comprise a "filled" bridge and certain embodiments comprise an "unfilled" bridge. Many details of the present embodiments are common to those described above in connection with the representative embodiments of FIGS. 1A-1E, which depict a single bridge (bridge 104) under a piezoelectric layer (piezoelectric layer 108). Generally, the common details are not repeated in the description of embodiments comprising a single bridge.

Figure 4A:
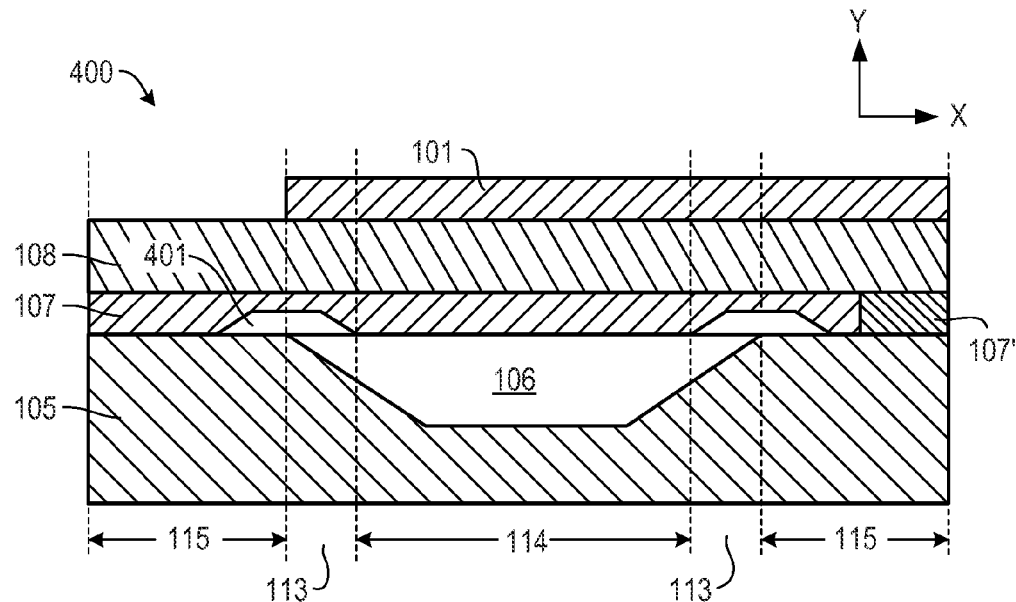
FIGS. 4A-4B are cross-sectional views of FBARs each having a bridge disposed in a single layer of the FBAR in accordance with representative embodiments.
Figure 4B:
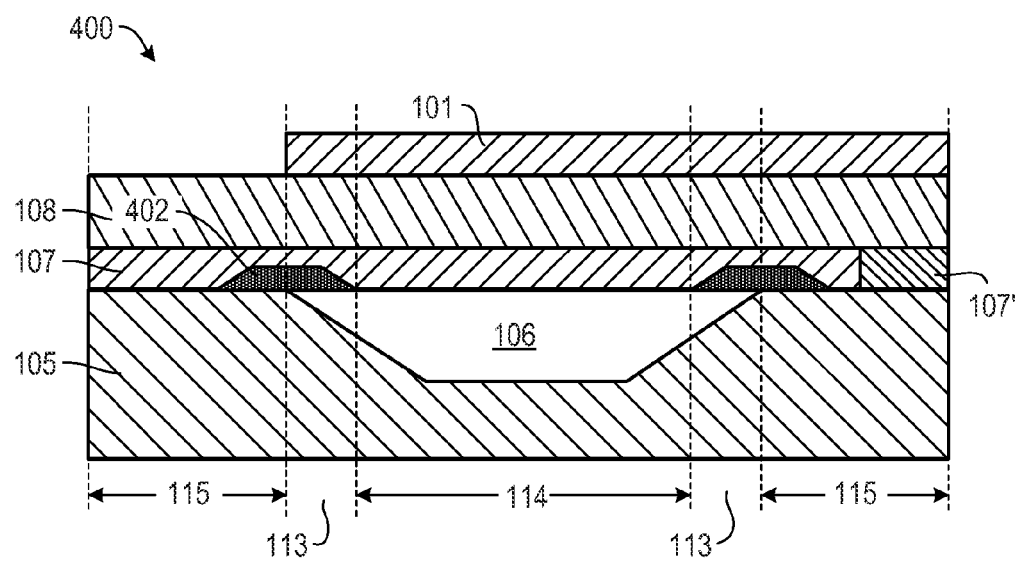

FIGS. 4A-4B show alternative cross-sectional views of FBAR 400 in accordance with representative embodiments. Referring to FIG. 4A, bridge 401 is provided under the bottom electrode 107 (over the substrate 105). The bridge 401 is unfilled (i.e., contains air). The bridge 401 is disposed around the perimeter of the active region 114 of the FBAR 400, and fosters confinement of modes in the active region 114 of the FBAR 400. For purposes of illustration of the improvement in mode confinement in the active region 114 of the FBAR 400, the bridge 401 has a width (x-dimension) of approximately 2.0-10.0 µm, and a height (y-dimension) of approximately 300-1500 Å, and overlap 113 of the bridge 401 over the cavity 106 is approximately 0 µm to approximately 10.0 µm, for example. An increase in the Q-factor of approximately 10% to approximately 50% (depending on frequency of operation, e.g., at 1.88 GHz) is expected compared to a conventional FBAR that does not include a bridge.

FIG. 4B shows bridge 402 provided under the bottom electrode 107 of FBAR 400. The bridge 402 is "filled" with a material (e.g., NEBSG or other material described above) to provide an acoustic impedance discontinuity. The bridge 402 is disposed around the perimeter of the active region 114 of the FBAR 400, and fosters confinement of modes in the active region 114 of the FBAR 400. Similar improvements in the Q-factor expected for bridge 401 are expected with the use of bridge 402. Beneficially, the use of a filled bridge provides a more rugged structure.

In alternative embodiments, the single unfilled or filled bridge may be provided under the top electrode 101 (over the piezoelectric layer 108) in the much the same manner as discussed above with reference to bridge 401, 402 in FIGS. 4A and 4B. An example of a bridge formed under a top electrode is described by commonly owned U.S. Patent Application U.S. Pat. App. Pub. No. 2010/0327994 to Choy et al., published Dec. 30, 2010, the disclosure of which is hereby incorporated by reference.

EMBODIMENTS COMPRISING TWO BRIDGES

In the embodiments described presently, two bridges are provided in an illustrative FBAR. One bridge is provided in one layer of the FBAR and a second bridge is provided in another layer of the FBAR in each embodiment. The bridges are generally concentric, although not circular in shape, and are disposed about a perimeter that encloses the active region of the FBAR. By placing the bridges under different combinations of layers, the various embodiments can be studied to test the degree of coupling of modes in the active region 114 (FBAR region) and the modes in the field region 115. Generally, the bridge decouples modes with a comparatively large propagation constant ($k_r$) from the modes in the field region 115. As described below, the various embodiments comprise combinations of "filled" and "unfilled" bridges. Many details of the present embodiments are common to those described above in connection with the representative embodiments of FIGS. 3A-3D, which depict two bridges (bridge 104 and bridge 110) under a piezoelectric layer (piezoelectric layer 108) and under a top electrode (top electrode 101), respectively.

FIGS. 5A-5D show alternative cross-sectional views of FBAR 500 in accordance with representative embodiments. The FBAR 500 includes multiple layers disposed over a substrate 105 having a cavity 106. Many aspects of the FBAR 500 are common to those of FBARs 100~400, and are not repeated in order to avoid obscuring the description of the representative embodiments presently described.

Figure 5A:
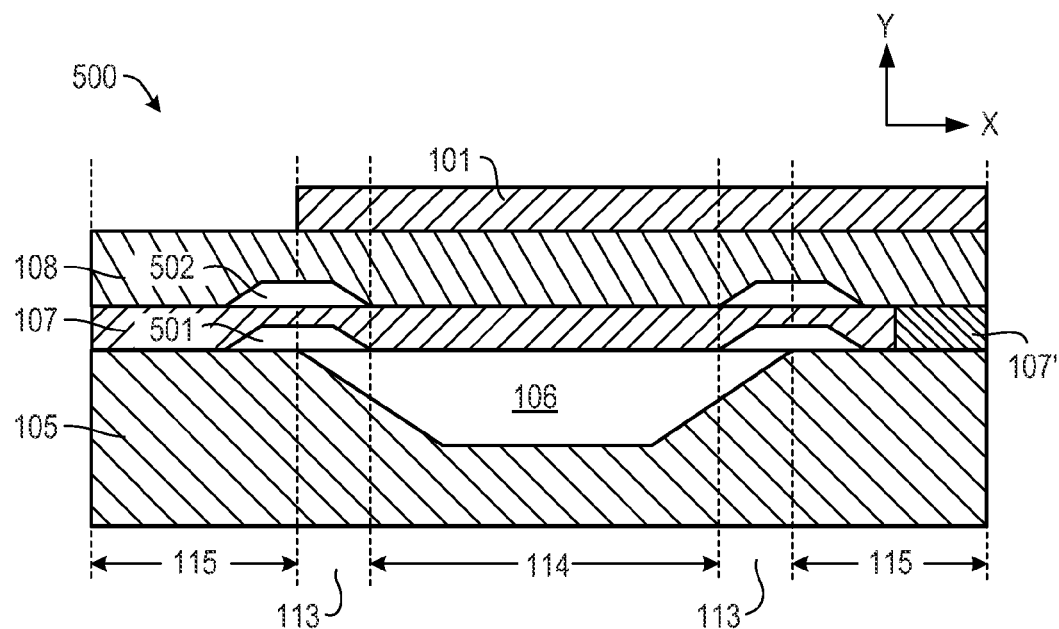
FIGS. 5A-5D are cross-sectional views of FBARs each having bridges disposed in two layers of the FBAR in accordance with representative embodiments.

FIG. 5A shows a first bridge 501 is provided under the bottom electrode 107 (over the substrate 105) and a second bridge 502 provided under the piezoelectric layer 108 (over the bottom electrode 107). Both the first bridge 501 and the second bridge 502 are unfilled (i.e., contain air). The first and second bridges 501, 502 are disposed along the perimeter of the active region 114 of the FBAR 500, and foster confinement of modes in the active region of the FBAR 500. For purposes of illustration of the improvement in mode confinement in the active region of the FBAR 500, the first and second bridges 501, 502 each have a width (x-dimension) of approximately 2.0 µm to approximately 10.0 µm, and a height (y-dimension) of approximately 300 to approximately 1500 Å, and overlap 113 of the first and second bridges 501, 502 over the cavity 106 is approximately 0 µm to approximately 10.0 µm, for example. An increase in the Q-factor of approximately 200% to approximately 400% (depending on frequency of operation, e.g. at 1.88 GHz) is expected compared to a conventional FBAR that does not include a bridge, e.g., due to the increased confinement of modes in the FBAR 500 by use of the first and second bridges 501, 502 of the representative embodiment.

Figure 5B:
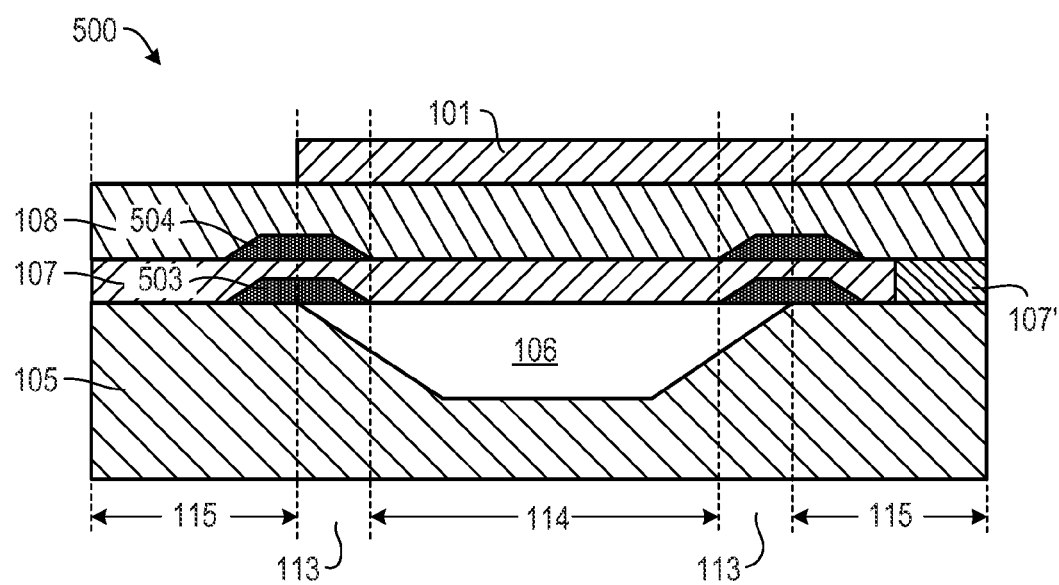

FIG. 5B shows a first bridge 503 provided under the bottom electrode 107 (over the substrate 105) that is filled (e.g., filled with NEBSG or other material), and a second bridge 504 provided under the piezoelectric layer 108 (over the bottom electrode 107) that is also filled. The first and second bridges 503, 504 are disposed around the perimeter of the active region of the FBAR 500, and foster confinement of modes in the active region of the FBAR 500. For the first and second bridges 503, 504 having the same width, height and overlap 113 of cavity 106 as the first and second bridges 501, 502, discussed above with reference to FIG. 5A, similar improvements in the Q-factor are expected. Beneficially, the use of two filled bridges provides a more rugged structure than the use of unfilled bridges.

Figure 5C:
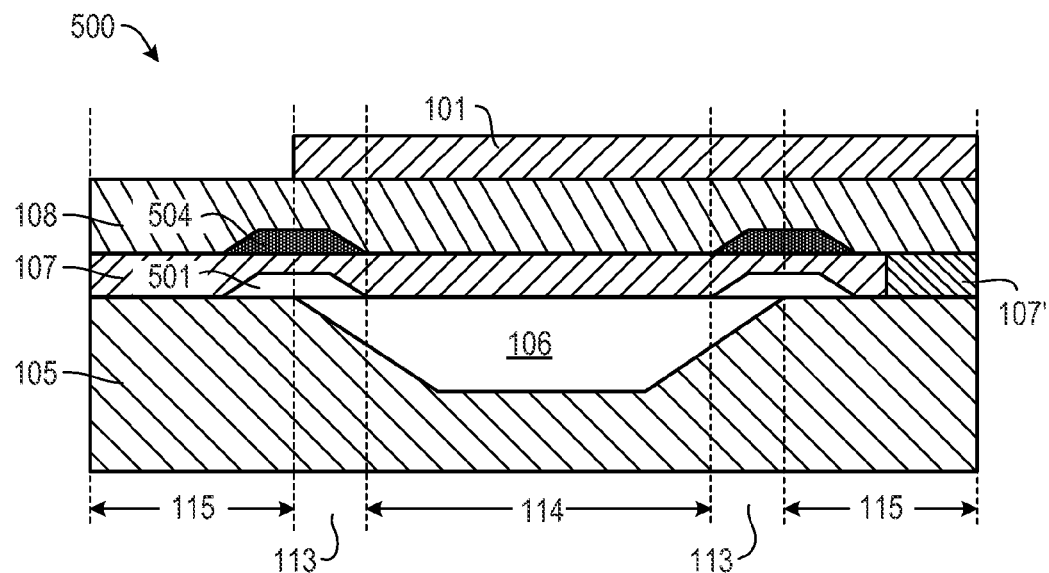
Figure 5D:
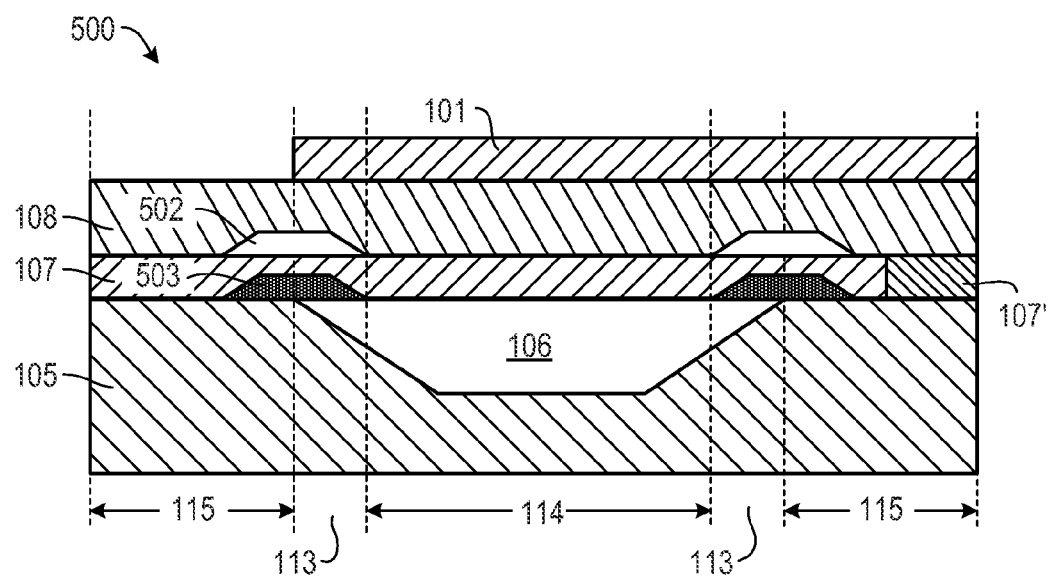

FIGS. 5C and 5D show embodiments in which one bridge is unfilled and the other bridge is filled. FIG. 5C shows a first bridge 501 provided under the bottom electrode 107 (over the substrate 105) that is unfilled, and a second bridge 504 provided under the piezoelectric layer 108 (over the bottom electrode 107) that is filled (e.g., filled with NEBSG or other fill material). FIG. 5D shows a first bridge 503 provided under the bottom electrode 107 (over the substrate 105) that is filled (e.g., filled with NEBSG or other fill material), and a second bridge 502 provided under the piezoelectric layer 108 (over the bottom electrode 107) that is unfilled. The first and second bridges 501, 504 in FIG. 5C and the first and second bridges 503, 502 in FIG. 5D are disposed around the perimeter of the active region of the FBAR 500, and foster confinement of modes in the active region of the FBAR 500. For the first and second bridges 501, 504 and 503, 502 having the same width, height and overlap 113 of cavity 106 as the first and second bridges 501, 502, discussed above with reference to FIG. 5A, similar improvements in the Q-factor are expected. Beneficially, the use of a filled bridge provides a more rugged structure than the use of unfilled bridges.

FIGS. 6A-6D show alternative cross-sectional views of FBAR 600 in accordance with representative embodiments. The FBAR 600 includes multiple layers disposed over a substrate 105 having a cavity 106. Many aspects of the FBAR 600 are common to those of FBARs 100~500, and are not repeated in order to avoid obscuring the description of the representative embodiments presently described.

Figure 6A:
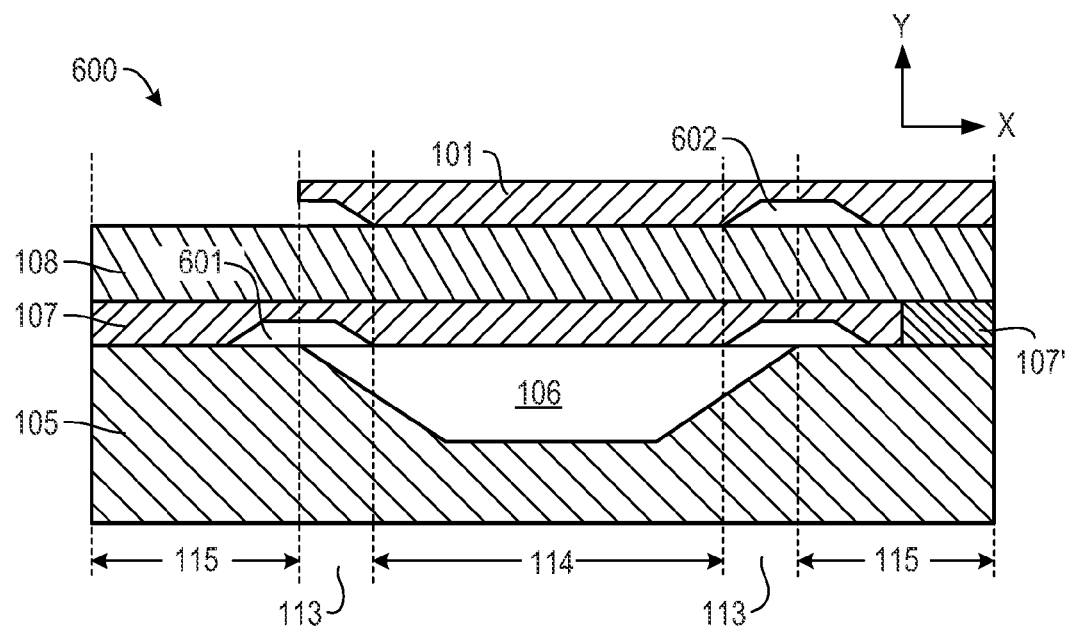
FIGS. 6A-6D are cross-sectional views of FBARs each having bridges disposed in two layers of the FBAR in accordance with representative embodiments.

FIG. 6A shows a first bridge 601 is provided under the bottom electrode 107 (over the substrate 105) and a second bridge 602 provided under the top electrode 101 (over the piezoelectric layer 108). Both the first bridge 601 and the second bridge 602 are unfilled (i.e., contain air). The first and second bridges 601, 602 are disposed along the perimeter of the active region 114 of the FBAR 600, and foster confinement of modes in the active region of the FBAR 600. For purposes of illustration of the improvement in mode confinement in the active region of the FBAR 600, the first and second bridges 601, 602 each have a width (x-dimension) of approximately 2.0 µm to approximately 10.0 µm, and a height (y-dimension) of approximately 300-1500 Å, and overlap 113 of the first and second bridges 601, 602 over the cavity 106 is approximately 0 µm to approximately 10.0 µm, for example. An increase in the Q-factor of approximately 200% to approximately 400% (depending on frequency of operation, e.g. at 1.88 GHz) is expected compared to a conventional FBAR that does not include a bridge, e.g., due to the increased confinement of modes in the FBAR 600 by use of the first and second bridges 601, 602 of the representative embodiment.

Figure 6B:
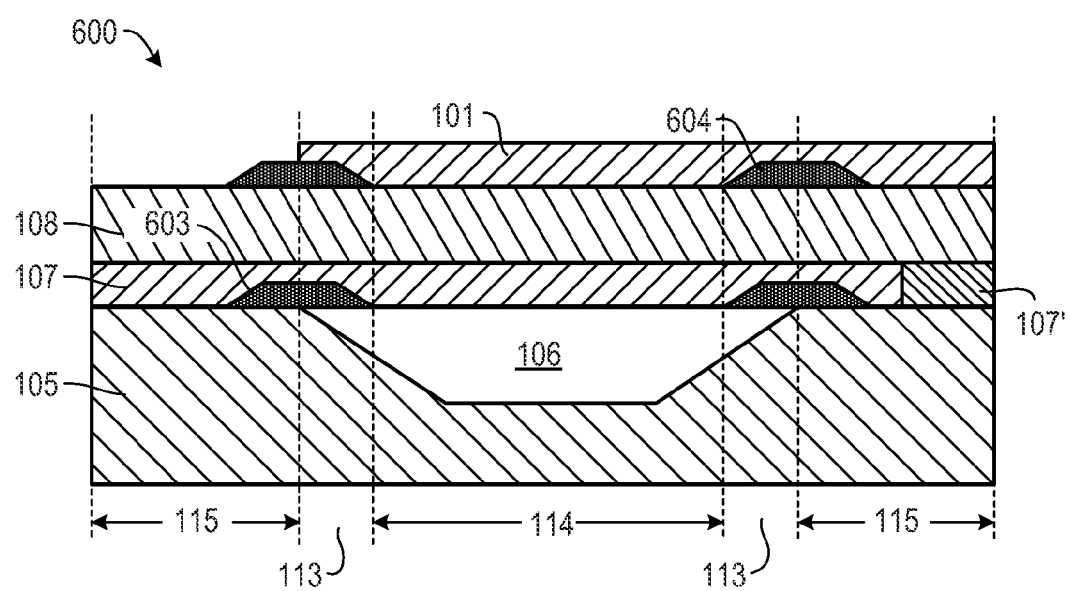

FIG. 6B shows a first bridge 603 provided under the bottom electrode 107 (over the substrate 105) that is filled (e.g., filled with NEBSG or other fill material), and a second bridge 604 provided under the top electrode 101 (over the piezoelectric layer 108) that is also filled. The first and second bridges 603, 604 are disposed around the perimeter of the active region of the FBAR 600, and foster confinement of modes in the active region of the FBAR 600. For the first and second bridges 603, 604 having the same width, height and overlap 113 of cavity 106 as the first and second bridges 601, 602, discussed above with reference to FIG. 6A, similar improvements in the Q-factor are expected. Beneficially, the use of two filled bridges provides a more rugged structure than the use of unfilled bridges.

Figure 6C:
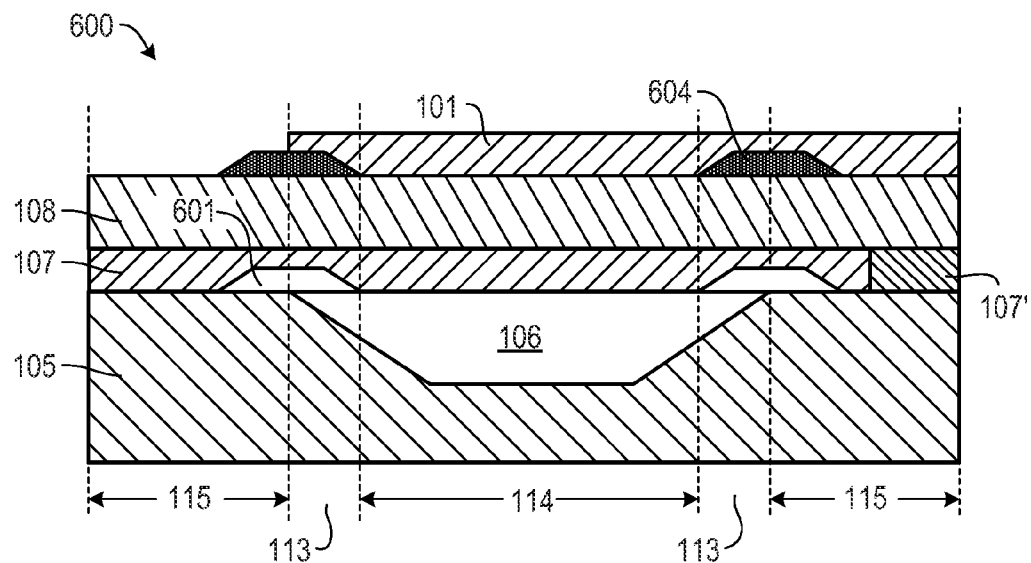
Figure 6D:
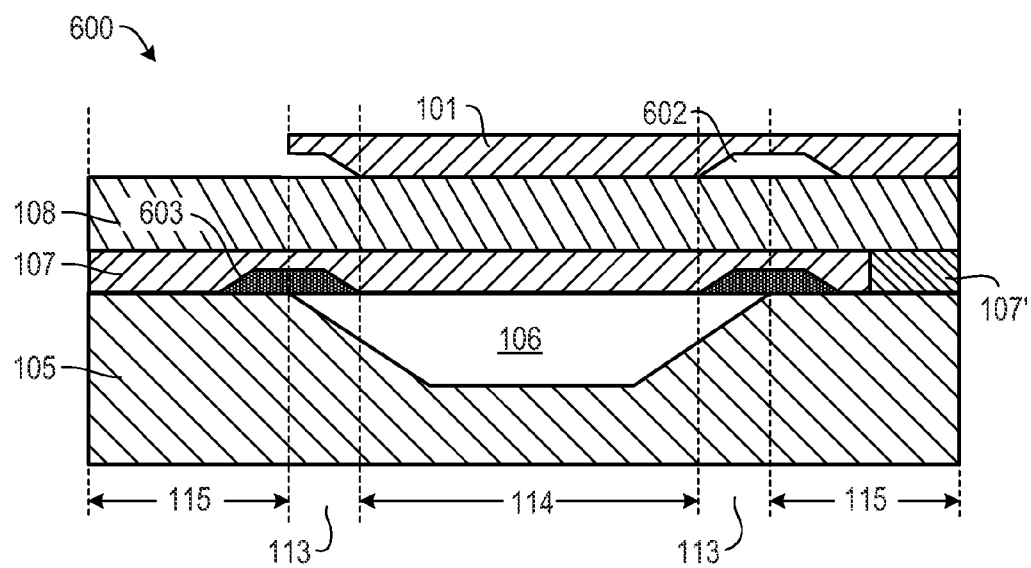

FIGS. 6C and 6D show embodiments in which one bridge is unfilled and the other bridge is filled. FIG. 6C shows a first bridge 601 provided under the bottom electrode 107 (over the substrate 105) that is unfilled, and a second bridge 604 provided under the top electrode 101 (over the piezoelectric layer 108) that is filled (e.g., filled with NEBSG or other fill material). FIG. 6D shows a first bridge 603 provided under the bottom electrode 107 (over the substrate 105) that is filled (e.g., filled with NEBSG or other fill material), and a second bridge 602 provided under the top electrode 101 (over the piezoelectric layer 108) that is unfilled. The first and second bridges 601, 604 in FIG. 6C and the first and second bridges 603, 602 in FIG. 6D are disposed around the perimeter of the active region of the FBAR 600, and foster confinement of modes in the active region of the FBAR 600. For the first and second bridges 601, 604 and 603, 602 having the same width, height and overlap 113 of cavity 106 as the first and second bridges 601, 602, discussed above with reference to FIG. 6A, similar improvements in the Q-factor are expected. Beneficially, the use of a filled bridge provides a more rugged structure than the use of unfilled bridges.

Each of the FBARs 100~600 may include various additional features without departing from the scope of the present teachings. For example, an inner raised region and/or an outer raised region may be included on a top surface of the tope electrode (e.g., top electrode 101) in the active region of the FBAR active region 114). The inner raised region may be separated from the edges of the active region or from an inner edge of the outer raised region by a gap. Details of such inner and outer raised regions, including illustrative thickness and width dimensions of the inner and outer raised regions, as well as widths of corresponding gaps, are described in commonly owned U.S. patent application Ser. No. 13/074,094, to Shirakawa et al., entitled "Stacked Bulk Acoustic Resonator and Method of Fabricating Same," filed on Mar. 29, 2011, the disclosure of which is hereby incorporated by reference. The combination of the bridges, the inner raised region and/or the outer raised regions further improves mode confinement in the active region (e.g., active region 114) of the representative FBARs 100~600.

In accordance with illustrative embodiments, BAW resonator structures comprising bridges and their methods of fabrication are described. One of ordinary skill in the art would appreciate that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and. scope of the appended claims.

The invention claimed is:

1. A thin film bulk acoustic resonator (FBAR) structure, comprising:
   a substrate;
   a cavity disposed in the substrate;
   a first electrode disposed over the substrate and the cavity, wherein the first electrode substantially covers the cavity;
   a planarization layer abutting an edge of the first electrode;
   a piezoelectric layer disposed over the first electrode and the planarization layer;
   a second electrode disposed over the piezoelectric layer; and
   a bridge disposed in the piezoelectric layer and along a perimeter of an active region of the FBAR, the bridge being disposed partially over the substrate and extending past an edge of the cavity.

2. The FBAR structure as claimed in claim 1, wherein the bridge comprises an unfilled bridge, containing air.

3. The FBAR structure as claimed in claim 1, wherein the bridge comprises a filled bridge, containing a dielectric material or a metal.

4. The FBAR structure as claimed in claim 3, wherein the dielectric material comprises one of non-etchable borosilicate glass (NEBSG), carbon doped silicon dioxide (CDO), or silicon carbide (SiC).

5. The FBAR structure as claimed in claim 3, wherein the metal is one of tungsten (W), molybdenum (Mo), copper (Cu) cu iridium (Ir).

6. The FBAR structure as claimed in claim 1, wherein the bridge has a trapezoidal cross-sectional shape.

7. A thin film bulk acoustic resonator (FBAR) structure, comprising:
   a substrate;
   a cavity disposed in the substrate;
   a first electrode disposed over a substrate, wherein the first electrode substantially covers the cavity;
   a planarization layer abutting an edge of the first electrode;
   a piezoelectric layer disposed over the first electrode and the planarization layer;
   a second electrode disposed over the piezoelectric layer;
   a first bridge disposed in the piezoelectric layer and along a perimeter of an active region of the FBAR, the bridge being disposed partially over the substrate and extending past an edge of the cavity; and
   a second bridge disposed between the piezoelectric layer and the second electrode.

8. The FBAR structure as claimed in claim 7, wherein each of the first bridge and the second bridge comprises an unfilled bridge, containing air.

9. The FBAR structure as claimed in claim 7, wherein each of the first bridge and the second bridge comprises a filled bridge, containing a fill material having an acoustic impedance.

10. The FBAR structure as claimed in claim 7, wherein the perimeter is a first perimeter of the active region of the FBAR, and the second bridge is disposed along a second perimeter of the FBAR.

11. The FBAR structure as claimed in claim 10, wherein the second perimeter is the same as the first perimeter.

12. The FBAR structure as claimed in claim 10, wherein the second perimeter is different than the first perimeter.

13. A thin film bulk acoustic resonator (FBAR) structure, comprising:
   a first electrode disposed over a substrate;
   a piezoelectric layer disposed over the first electrode;
   a second electrode disposed over the piezoelectric layer;
   a first bridge disposed between the first electrode and the piezoelectric layer, the first bridge being an unfilled bridge containing air; and
   a second bridge disposed between the piezoelectric layer and the second electrode, the second bridge being a filled bridge, containing a fill material having an acoustic impedance.

14. The FBAR structure as claimed in claim 13, wherein the first bridge is disposed along a first perimeter of the FBAR, and the second bridge is disposed along a second perimeter of the FBAR.

15. The FBAR structure as claimed in claim 14, wherein the second perimeter is the same as the first perimeter.

16. The FBAR structure as claimed in claim 14, wherein the second perimeter is different than the first perimeter.

17. A thin film bulk acoustic resonator (FBAR) structure, comprising:
   a first electrode disposed over a substrate;
   a piezoelectric layer disposed over the first electrode;
   a second electrode disposed over the piezoelectric layer;
   a first bridge disposed between the first electrode and the piezoelectric layer, the first bridge being a filled bridge containing a fill material having an acoustic impedance; and
   a second bridge disposed between the piezoelectric layer and the second electrode, the second bridge being a unfilled bridge containing air.

18. The FBAR structure as claimed in claim 17, wherein the first bridge is disposed along a first perimeter of an active region of the FBAR, and the second bridge is disposed along a second perimeter of the FBAR.

19. The FBAR structure as claimed in claim 18, wherein the second perimeter is the same as the first perimeter.

20. The FBAR structure as claimed in claim 18, wherein the second perimeter is different than the first perimeter.

* * * * *